(12) United States Patent  
Arakawa et al.

(10) Patent No.: US 8,183,073 B2  
(45) Date of Patent: May 22, 2012

(54) METHOD OF MANUFACTURING A SEMICONDUCTOR DEVICE WITH QUANTUM DOTS FORMED BY SELF-ASSEMBLED GROWTH

(75) Inventors: Yasuhiko Arakawa, Kanagawa (JP); Denis Guimard, Tokyo (JP); Shiro Tsukamoto, Tokushima (JP); Hiroji Ebe, Tokyo (JP); Mitsuru Sugawara, Kawasaki (JP)

(73) Assignees: Fujitsu Limited, Kawasaki (JP); The University of Tokyo, Tokyo (JP)

( * ) Notice: Subject to any disclaimer, the term of this patent is extended or adjusted under 35 U.S.C. 154(b) by 0 days.

(21) Appl. No.: 12/926,893

(22) Filed: Dec. 16, 2010

(65) Prior Publication Data

US 2011/0134950 A1    Jun. 9, 2011

Related U.S. Application Data

(62) Division of application No. 11/798,627, filed on May 15, 2007, now Pat. No. 7,892,871.

(30) Foreign Application Priority Data

May 15, 2006  (JP) ................................. 2006-135120  
May 8, 2007  (JP) ................................. 2007-123592

(51) Int. Cl.  
  *H01L 21/00* (2006.01)  
(52) U.S. Cl. ........ 438/34; 438/22; 257/88; 257/E29.071  
(58) Field of Classification Search .................. 438/962, 438/22; 257/88, E29.071  
See application file for complete search history.

(56) References Cited

U.S. PATENT DOCUMENTS

| | | | | |
|---|---|---|---|---|
| 5,449,561 A | * | 9/1995 | Golding et al. | ............... 428/457 |
| 5,481,120 A | * | 1/1996 | Mochizuki et al. | ............. 257/49 |
| 5,625,635 A | * | 4/1997 | Kurtz et al. | .............. 372/45.011 |
| 5,686,351 A | * | 11/1997 | Golding et al. | ................. 438/47 |
| 5,726,462 A | * | 3/1998 | Spahn et al. | ..................... 257/76 |
| 5,995,529 A | * | 11/1999 | Kurtz et al. | ................ 372/45.01 |

(Continued)

FOREIGN PATENT DOCUMENTS

JP    2004-253667    9/2004

(Continued)

OTHER PUBLICATIONS

Tetsuya Matsuura et al.: "Elongation of Emission Wavelength of GaInAsSb-Covered Quantum Dots Gown by Molecular Beam Epitaxy", *Japanese Journal of Applied Physics*, vol. 43, No. 1A/B, 2004, pp. L82-L84.

(Continued)

*Primary Examiner* — Thao Le  
*Assistant Examiner* — Eric Jones  
(74) *Attorney, Agent, or Firm* — Kratz, Quintos & Hanson, LLP

(57) ABSTRACT

The method of manufacturing the semiconductor device comprises the step of forming quantum dots 16 on a base layer 10 by self-assembled growth; the step of irradiating Sb or GaSb to the surface of the base layer 10 before or in the step of forming quantum dots 16; the step of etching the surfaces of the quantum dots 16 with an As raw material gas to thereby remove an InSb layer 18 containing Sb deposited on the surfaces of the quantum dots 16; and growing a capping layer 22 on the quantum dots 16 with the InSb layer 18 removed.

14 Claims, 31 Drawing Sheets

U.S. PATENT DOCUMENTS

| | | | | |
|---|---|---|---|---|
| 6,071,109 | A * | 6/2000 | Biefeld et al. | 427/255.34 |
| 6,118,686 | A * | 9/2000 | Taira et al. | 365/129 |
| 6,294,794 | B1 * | 9/2001 | Yoshimura et al. | 257/14 |
| 6,300,558 | B1 * | 10/2001 | Takamoto et al. | 136/262 |
| 6,573,527 | B1 * | 6/2003 | Sugiyama et al. | 257/14 |
| 6,583,033 | B2 * | 6/2003 | Hall et al. | 438/479 |
| 6,600,169 | B2 * | 7/2003 | Stintz et al. | 257/14 |
| 6,621,842 | B1 * | 9/2003 | Dapkus | 372/45.01 |
| 6,642,070 | B2 * | 11/2003 | Jiang et al. | 438/22 |
| 6,700,056 | B2 * | 3/2004 | Zuppero et al. | 136/252 |
| 6,750,075 | B2 * | 6/2004 | Razeghi | 438/48 |
| 6,961,358 | B2 * | 11/2005 | Erbert et al. | 372/45.01 |
| 7,295,586 | B2 * | 11/2007 | Kwon | 372/45.01 |
| 7,432,175 | B2 * | 10/2008 | Huffaker et al. | 438/479 |
| 7,456,423 | B2 * | 11/2008 | Liu et al. | 257/14 |
| 7,683,392 | B2 * | 3/2010 | Kawaguchi | 257/97 |
| 7,795,609 | B2 * | 9/2010 | Huffaker et al. | 257/14 |
| 2001/0023942 | A1 * | 9/2001 | Kim et al. | 257/14 |
| 2001/0028055 | A1 * | 10/2001 | Fafard et al. | 257/17 |
| 2002/0081825 | A1 * | 6/2002 | Williams et al. | 438/493 |
| 2002/0176474 | A1 * | 11/2002 | Huang et al. | 372/96 |
| 2003/0156610 | A1 * | 8/2003 | Kwon | 372/45 |
| 2004/0168626 | A1 * | 9/2004 | Moeck et al. | 117/84 |
| 2004/0197070 | A1 * | 10/2004 | Takemoto et al. | 385/147 |
| 2008/0073716 | A1 * | 3/2008 | Yamamoto et al. | 257/347 |

FOREIGN PATENT DOCUMENTS

| | | |
|---|---|---|
| JP | 2004335665 A * | 11/2004 |
| JP | 2005093553 A * | 4/2005 |

OTHER PUBLICATIONS

Y. Sun et al.: "The effect of antimony in the growth of indium arsenide quatum dots in gallium arsenide (001)", *Journal of Applied Physics*, vol. 97, 2005, pp. 053503-1-053503-6.

Jun Tatebayashi et al.: "1.28 μm lasing from stacked InAs/GaAs quantum dots with low-temperature-grown AlGaAs cladding layer by metalorganic chemical vapor deposition", Applied Physics Letters, vol. 86, 2005, pp. 053107-1-053107-3.

Japanese Office Action issued in counterpart appln. No. 2007-123592 mailed Nov. 15, 2011 with English translation (10 pages).

* cited by examiner

METHOD OF MANUFACTURING A SEMICONDUCTOR DEVICE WITH QUANTUM DOTS FORMED BY SELF-ASSEMBLED GROWTH

CROSS REFERENCE TO RELATED APPLICATIONS

This application is a division of U.S. patent application Ser. No. 11/798,627 filed May 15, 2007 now U.S. Pat. No. 7,892,871 which application is based upon and claims priority of Japanese Patent Application No. 2006-135120 filed May 15, 2006 and Japanese Patent Application No. 2007-123592 filed May 8, 2007, the entire contents of which are incorporated herein by reference.

BACKGROUND OF THE INVENTION

The present invention relates to a method of manufacturing a semiconductor device, more specifically, a method of manufacturing a semiconductor device in which quantum dots are formed by self-assembled growth.

Recently, semiconductor devices using quantum dots, e.g., quantum dot lasers including quantum dots formed in the active layers of the semiconductor lasers, etc. are much studied.

As a technique of forming the quantum dots used in the quantum dot laser, etc. is known a technique of forming the quantum dots by self-assembled growth. This technique utilizes the phenomena that a lattice misfit semiconductor is grown by vapor phase epitaxy to thereby form self-assembled quantum dots of the three-dimensional fine structure.

For the self-assemble of the quantum dots, several modes are known. Among them, the most popular mode is a mode called Stranski-Krastanow mode (S-K mode). S-K mode is a mode that the epitaxially grown semiconductor crystals grow two-dimensionally (into film) at the start of the growth but grow three-dimensionally on the stage where the film has exceeded the elastic limit. A film whose lattice constant is larger than that of a material below is epitaxially grown to thereby be self-assembled quantum dots, i.e., three-dimensional grown islands.

However, the conventional quantum dot laser having the quantum dots formed by self-assembled growth has a quantum dot density of below $5 \times 10^{10}$ cm$^{-2}$ including $5 \times 10^{10}$ cm$^{-2}$ and, because of such insufficient density, disadvantageously cannot make high-speed direct modulation of above 10 Gbps including 10 Gbps. Then, to improve the density of the quantum dots, new methods of growing the quantum dots are proposed. As one of such new methods of growing the quantum dots is a method of irradiating Sb to a base semiconductor layer for the quantum dots to be grown on before the quantum dots are grown.

The conventional method of growing the quantum dots including the step of irradiating Sb to the base semiconductor layer for the quantum dots to be grown on will be explained with reference to FIGS. 31A-31D. In the following, quantum dots of InAs are grown on a base semiconductor layer of GaAs.

First, Sb is irradiated to the surface of the base layer 100 of GaAs. Thus, on the surface of the base layer 100, an Sb layer 102 of substantially a monolayer (ML) is formed (FIG. 31A).

Then, a quantum dot layer 104 of InAs is formed by, e.g., MOCVD on the base layer 100 with the Sb layer 102 on the surface. The lattice constant of InAs is different from that of GaAs forming the base layer 100, and quantum dots 106 are formed in the quantum dot layer 104 by S-K mode (FIG. 31B).

While the quantum dot layer 104 is growing, the Sb on the surface of the base layer 100 diffuses mutually with the InAs forming the quantum dot layer 104 to be deposited on the surface of the quantum dot layer 104. Thus, on the surface of the quantum dot layer 104, a surface layer containing the Sb, e.g., an InSb layer 108 is formed (FIG. 31C).

Next, on the quantum dot layer 104 with the InSb layer 108 formed on the surface, a capping layer 110 of GaAs is grown by, e.g., MOCVD, burying the quantum dots 106 (FIG. 31D).

The background arts of the present invention are disclosed in, e.g., Japanese published unexamined patent application No. 2005-093553, Japanese published unexamined patent application No. 2004-335665 and Japanese published unexamined patent application No. Hei 6-204498.

It is known that the method of growing the quantum dots described above with reference to FIGS. 31A-31D can increase the density of the quantum dots about double in comparison with the conventional methods. On the other hand, the method has a disadvantage that the crystal quality of the quantum dots is degraded, and the emission efficiency of the quantum dots is lowered.

Furthermore, in the quantum dot laser using the quantum dot layer as the active layer, quantum dot layers are laid to form the active layer. However, when a number of the laid quantum dot layers is large, the quantum dot laser has disadvantages that strains of the lower quantum dot layers are accumulated, and the upper quantum dot layers are largely different from the lower quantum dot layers in the size distribution and the density of the quantum dots, and defects take place, and other disadvantages.

In the conventional quantum dot laser, the cladding layer must be grown at a relatively low growth temperature of, e.g., about 600° C. so that the quantum dots may not be degraded. The growth of the cladding layer at such low growth temperature increases the roughness of the interface between the cladding layer and semiconductor layers, such as the SCH (Separate Confinement Heterostructure) layer, the active layer, the contact layer, etc., which are adjacent to the cladding layer. Resultantly, a disadvantage that the scattering loss of light is increased takes place.

SUMMARY OF THE INVENTION

An object of the present invention is to provide a method of manufacturing a semiconductor device which can form quantum dots of high crystal quality in high density.

Another object of the present invention is to provide a method of manufacturing a semiconductor device which can form a plurality of quantum dot layers repeatedly without causing defects while a size distribution and a density of quantum dots are kept uniform among the layers.

Further another object of the present invention is to provide a method of manufacturing a semiconductor device which, when an optical semiconductor device uses a quantum dot layer as the active layer, can grow a cladding layer and a contact layer of high crystal quality on the active layer without degrading the emission characteristics of the quantum dots.

According to one aspect of the present invention, there is provided a method of manufacturing a semiconductor device comprising the steps of: forming a quantum dot on a base layer by self-assembled growth; irradiating an organic Sb raw material gas to a surface of the quantum dot; and growing a capping layer on the quantum dot.

According to another aspect of the present invention, there is provided a method of manufacturing a semiconductor device comprising the steps of: forming a quantum dot on a base layer by self-assembled growth; irradiating Sb or GaSb to a surface of the base layer before or in the step of forming the quantum dot; and growing a capping layer on the quantum dot.

According to further another aspect of the present invention, there is provided a method of manufacturing a semiconductor device comprising the step of: repeating the step of growing a quantum dot layer including a quantum dot formed by self-assembled growth; the step of irradiating an organic Sb raw material gas to a surface of the quantum dot layer; and the step of growing a capping layer on the quantum dot layer to thereby form above a semiconductor substrate an active layer including n layers (n is an integer of 2 or more) of the quantum dot layers, in the step of forming the active layer, a V/III ratio of the quantum dot layer of the (i+1)-th layer (i is an integer satisfying $1 \leq i < n-1$) in the growth being set higher than a V/III ratio of the quantum dot layer of the i-th layer in the growth.

According to further another aspect of the present invention, there is provided a method of manufacturing a semiconductor device comprising the step of repeating the step of growing a quantum dot layer including a quantum dot formed by self-assembled growth; the step of irradiating Sb or GaSb to a surface of a base layer of the quantum dot layer before or in the step of growing the quantum dot layer; and the step of growing a capping layer on the quantum dot layer to thereby form above a semiconductor substrate an active layer including n layers (n is an integer of 2 or more) of the quantum dot layers, in the step of forming the active layer, a V/III ratio of the quantum dot layer of the (i+1)-th layer (i is an integer satisfying $1 \leq i \leq n-1$) in the growth being set higher than a V/III ratio of the quantum dot layer of the i-th layer in the growth.

According to the present invention, an organic Sb raw material gas is irradiated to the surface of a quantum dot to thereby form a covering layer containing Sb, whereby the configuration of the quantum dot is retained, and the emission wavelength of the quantum dot can be made longer.

According to the present invention, in the method of manufacturing a semiconductor device comprising the step of irradiating Sb or GaSb to the surface of a base layer before or in the step of forming a quantum dot, the surface of the quantum dot is etched with an As raw material gas after the step of forming the quantum dot and before the step of forming a capping layer, to thereby remove the surface layer containing Sb deposited on the surface of the quantum dot, whereby the quantum dot can have high crystal quality and can be densely formed.

According to the present invention, the capping layer is grown at a growth rate of below 0.275 nm/s including 0.275 nm/s sufficient for the Sb on the surface of the quantum dot to diffuse to the uppermost surface of the capping layer, whereby the crystal quality of the quantum dot can be improved.

According to the present invention, in the step of forming an active layer including n layers of quantum dot layers (n is a integer of 2 or more), the V/III ratio of the quantum dot layer of the (i+1)-th layer (i is an integer satisfying $1 \leq i \leq n-1$) in the growth is set higher than the V/III ratio of the quantum dot layer of the i-th layer in the growth, whereby the quantum dot layers can be repeatedly formed into plural layers without causing defects, and with the size distribution and the density of the quantum dots retained uniform among the layers.

According to the present invention, a cladding layer is grown above the active layer including the quantum dot at a growth temperature of 610-660° C. by using trimethylgallium as the Ga raw material, whereby the upper cladding layer of high crystal quality can be grown without deteriorating the emission characteristics of the quantum dot and breaking the quantum dot.

According to the present invention, a contact layer is grown above the cladding layer at a growth temperature of 600-610° C. by using triethylgallium as the Ga raw material, whereby the contact layer of high crystal quality can be formed without deteriorating the emission characteristics of the quantum dot and breaking the quantum dot.

DETAILED DESCRIPTION OF THE PREFERRED EMBODIMENTS

[Principle of the Present Invention]

First, the principle of the present invention will be explained.

The conventional method of growing quantum dots which irradiates Sb to the surface of a base layer for quantum dots to be formed on before the quantum dots are grown has the advantage that quantum dots of high density can be formed but has the disadvantage that the opto-electronic properties are degraded, via the introduction of Sb-related non-radiative defects, and the emission efficiency is lowered.

The inventors of the present application repeated experimental studies of the cause for this and have found that defects are present in the surface layer, such as InSb layer or others, containing Sb, which is formed by Sb being deposited on the surface of the quantum dot layer while the quantum dots are growing.

Figure 1:
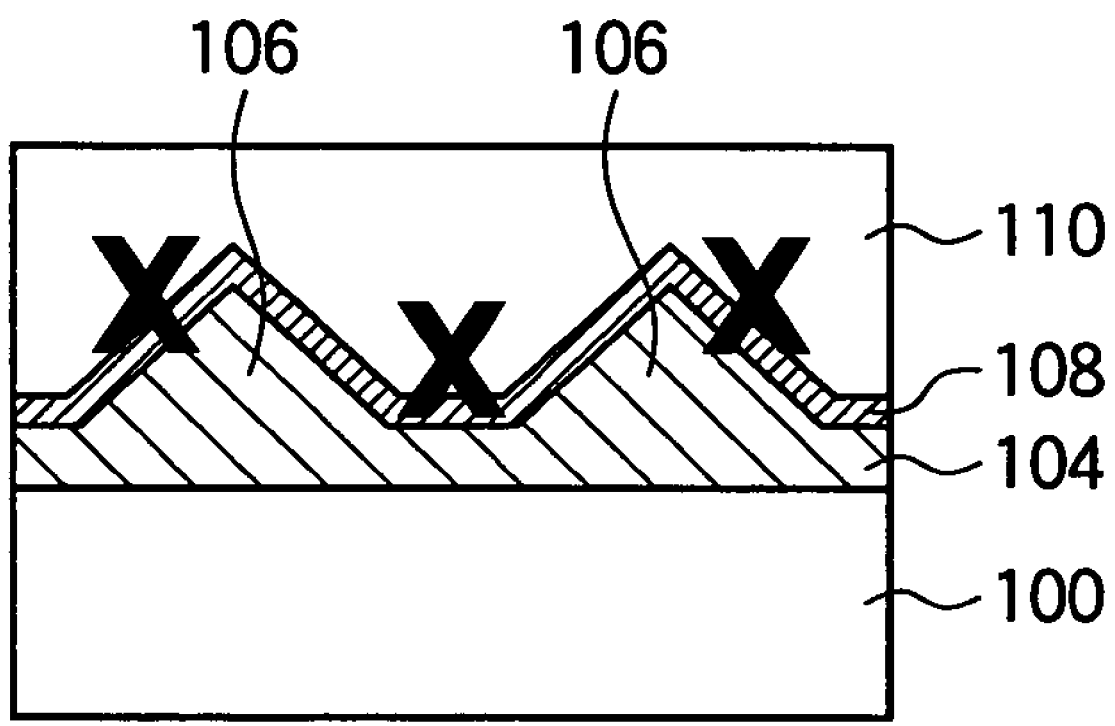
FIG. 1 is a diagrammatic sectional view explaining the defects caused in the conventional method of growing quantum dots.

FIG. 1 is a diagrammatic sectional view explaining the defects caused in the conventional method of growing quantum dots illustrated in FIGS. 31A-31D. In the conventional method of growing quantum dots, as illustrated, Sb is deposited on the surface of a quantum dot layer 104 while the quantum dot layer 104 is growing, and a surface layer containing Sb, e.g., an InSb layer 108 is formed. In the InSb layer 108, non-radiative defects indicated by the x marks in the drawing are formed.

Such InSb layer 108 will affect the opto-electronic properties of the quantum dot layer 104 and causes the decrease of the emission efficiency. Accordingly, the Sb deposited on the surface of the quantum dot layer 104 is substantially removed, whereby quantum dots of high quality optical properties at room temperature can be formed in high density.

The method of manufacturing the semiconductor device according to the present invention is based on such knowledge and is characterized mainly by the step of removing the Sb deposited on the surface of the quantum dot layer. The method of manufacturing the semiconductor device according to the present invention will be summarized with reference to FIGS. 2A-2D and 3A-3C. FIGS. 2A-2D and 3A-3C are sectional views showing the steps of the method of manufacturing the semiconductor device according to the present invention, which summarize the method.

Figure 2A:
FIGS. 2A-2D and 3A-3C are sectional views showing the steps of the method of manufacturing the semiconductor device according to the present invention, which summarize the method.

First, an organic Sb raw material gas, for example, is irradiated to the surface of a base layer 10 of GaAs to irradiate Sb to the surface. Thus, an Sb layer 12 of, e.g., an about 1 ML is formed on the surface of the base layer 10 (FIG. 2A). Before quantum dots are grown, Sb has been irradiated to the surface of the base layer 10, whereby quantum dots can be grown in high density. In place of Sb, GaSb may be irradiated to the surface of the base layer 10. Sb or GaSb may be irradiated to the surface of the base layer 10 while the quantum dots are being grown.

Figure 2B:
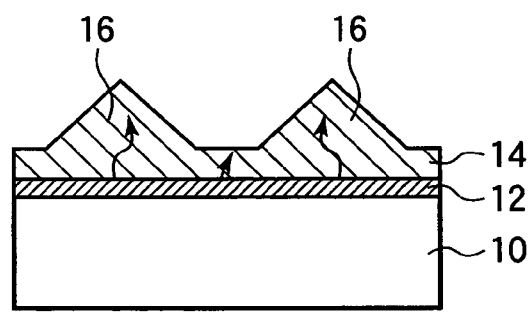

Then, on the base layer 10 with the Sb layer 12 formed on the surface, a quantum dot layer 14 of InAs is grown. Because of the lattice constant of InAs, which is different from that of GaAs of the base layer 10, quantum dots 16 are formed in the quantum dot layer 14 by the self-assembled growth called S-K mode (FIG. 2B).

Figure 2C:
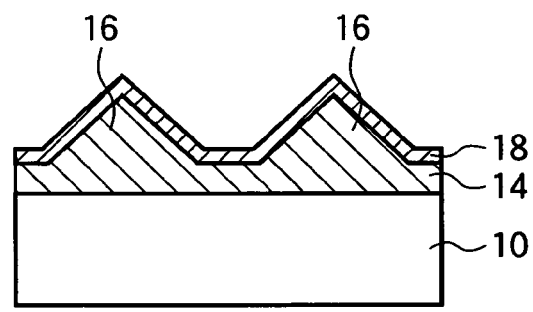

While the quantum dot layer 14 is being grown, the Sb on the surface of the base layer 10 diffuses mutually with the As of the InAs forming the quantum dot layer 14 to go on depositing on the surface of the quantum dot layer 14. Thus, a surface layer containing Sb, e.g., an InSb or InAsSb layer 18 is formed on the surface of the quantum dot layer 14 (FIG. 2C).

Figure 2D:
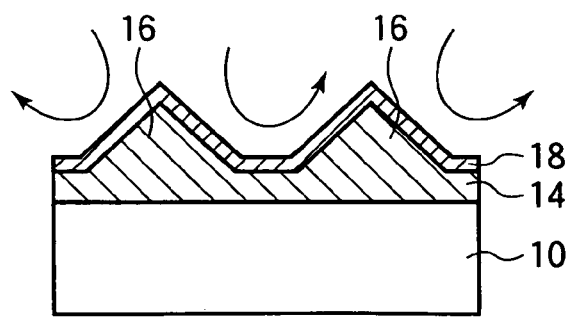
Figure 3A:
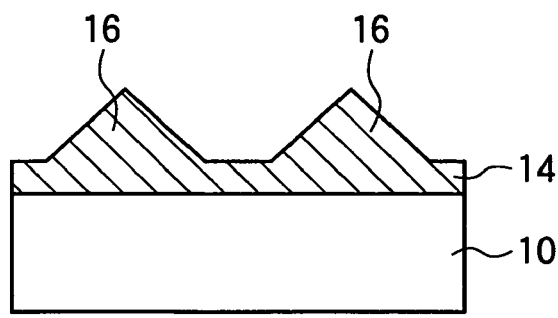

Then, an As raw material is irradiated for a prescribed period of time to the surface of the quantum dot layer 14 with the InSb layer 18 formed on to thereby etch the surface of the quantum dot layer 14 with the As raw material gas (FIG. 2D). The As raw material irradiated for a prescribed period of time can be, e.g., tertiarybutylarsine (TBA), $AsH_3$, $As_2$ or $As_4$. Thus, the InSb layer 18 on the surface of the quantum dot layer 14 is substantially removed (FIG. 3A).

As described above, one of the main characteristics of the method of manufacturing the semiconductor device according to the present invention is that the As raw material gas is irradiated for a prescribed period of time to the surface of the quantum dot layer 14 with the InSb layer 14 formed on to thereby etch the surface of the quantum dot layer 14 with the As raw material gas. The etching with the As raw material gas removes substantially the InSb layer 18, whereby defects of the quantum dots 16 can be decreased, and the optical quality of the quantum dots 16 can be improved.

Figure 3B:
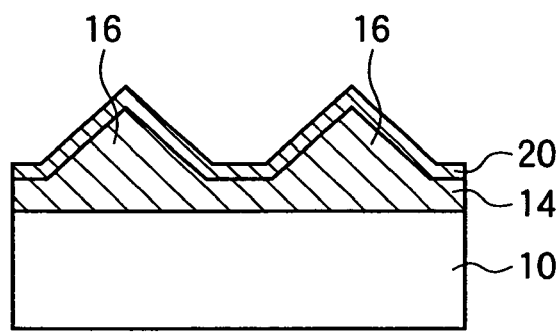

Then, to the surface of the quantum dot layer 14, an organic Sb raw material gas and a group III metal (In, Ga, Al) organic raw material gas are concurrently irradiated. Thus, a covering layer 20 containing group III metal (In, Ga, Al) and Sb is formed on the surface of the quantum dot layer 14 (FIG. 3B). The covering layer 20 containing group III metal and Sb is formed specifically of InSb, GaSb, AlSb or their mixed crystal.

As described above, one of the main characteristics of the method of manufacturing the semiconductor device according to the present invention is that the organic Sb raw material gas and the group III metal (In, Ga, Al) organic raw material gas are irradiated to the surface of the quantum dot layer 14.

The surfaces of the quantum dots 16 are coated with the covering layer 20 of InSb or others, whereby in the following step of growing a capping layer 22, the configuration of the quantum dots 16 can be retained, and the emission wavelength of the quantum dots 16 can be made longer.

The covering layer 20 of Sb may be formed by irradiating the organic Sb raw material gas alone without irradiating the group III metal organic raw material gas.

Figure 3C:
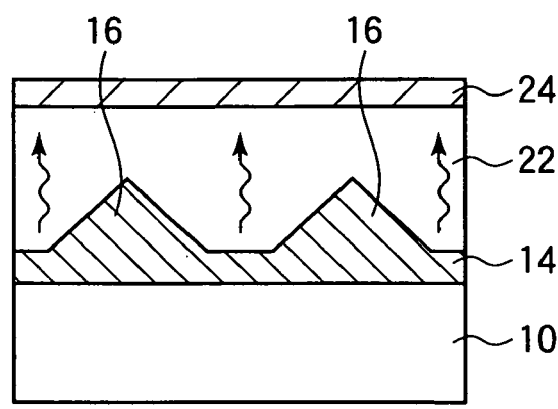

Then, on the quantum dot layer 14 with the covering layer 20 formed on the surface, a capping layer 22 of GaAs is grown, burying the quantum dots 16 (FIG. 3C).

While the capping layer 22 is being grown, the Sb of the covering layer 20 diffuses mutually with the As of the GaAs forming the capping layer 22 to go on depositing on the surface of the capping layer 22. Thus, a surface layer containing Sb, e.g., a GaSb layer 24 is formed on the surface of the capping layer 22 (FIG. 3C).

Here, the method of manufacturing the semiconductor device according to the present invention is characterized mainly also in that the capping layer 22 is grown at a low growing rate sufficient for the Sb to be diffused onto the most surface of the capping layer 22. Specifically, the capping layer 22 is grown at a growth rate of below 0.275 nm/s including 0.275 nm/s. Thus, the Sb on the surface of the quantum dot layer 14 can be sufficiently removed.

In the present invention, the step of growing the quantum dot layer 14 illustrated in FIGS. 2A to 2C may not be followed by the step of irradiating the As raw material gas for a prescribed period of time illustrated in FIGS. 2D and 2C and the step of forming the covering layer 20 illustrated in FIG. 3B, but maybe be followed by the step of growing the capping layer 22. In this case as well, the capping layer 22 is grown at a growth rate of below 0.275 nm/s including 0.275 nm/s, whereby the Sb deposited on the surface of the quantum dot layer 14 can be sufficiently removed. As described above, the capping layer 22 is grown at the low growth rate, whereby the Sb can be sufficiently removed, and the crystal quality of the quantum dots 16 can be improved.

Thus, according to the method of manufacturing the semiconductor device according to the present invention, quantum dots of high crystal quality can be grown in high density.

The quantum dots 16 of the semiconductor device thus manufactured by the present invention has a density of above, e.g., $4-5 \times 10^{10}$ cm$^{-2}$ including $4-5 \times 10^{10}$ cm$^{-2}$ and an emission wavelength which is as long as above, e.g., 1.3 µm including 1.3 µm.

Furthermore, when the step of forming the covering layer 20 illustrated in FIG. 3B is made, the interface between the quantum dot layer 14 and the capping layer 22 has the following structural characteristics.

Figure 4:
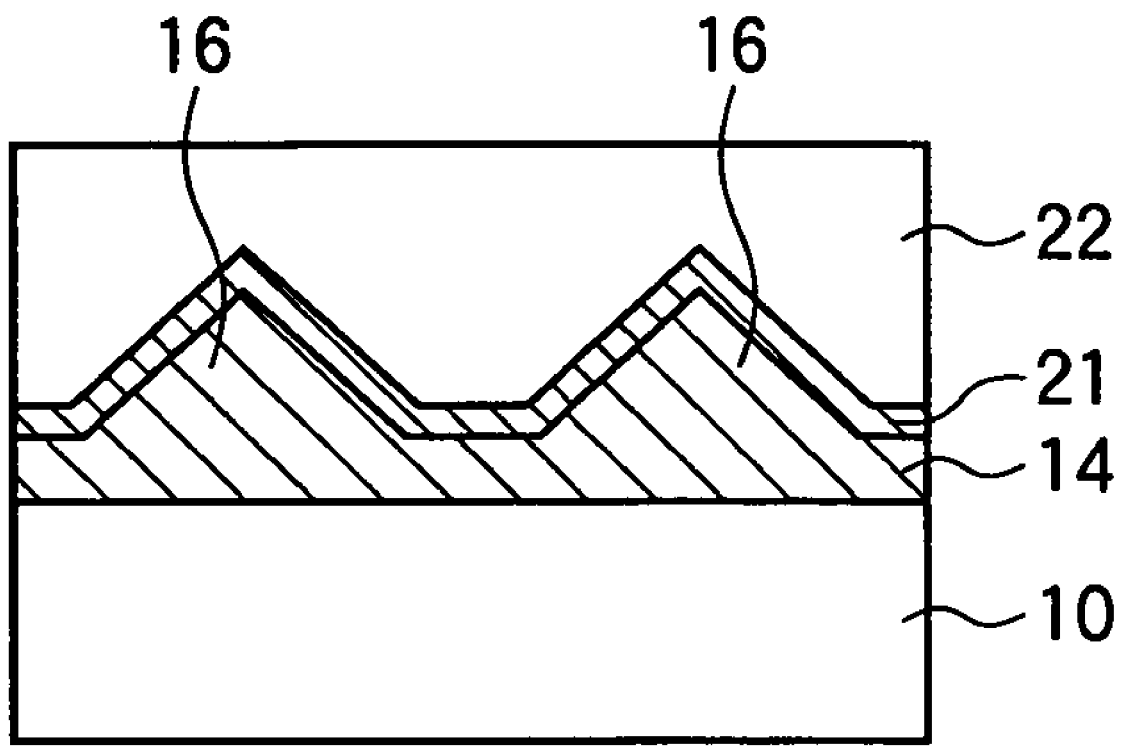
FIG. 4 is a diagrammatic sectional view showing the structure of the semiconductor device according to the present invention.

That is, even when the capping layer 22 is grown at low growth rate, the covering layer 20 between the quantum dot layer 14 and the capping layer 22 is not often removed. In this case, between the quantum dot layer 14 and the capping layer 22, as illustrated in FIG. 4, a thin film 21 containing group III metal and Sb, i.e., InSb, GaSb, AlSb or their mixed crystal remains. The film thickness of the thin film 21 is, e.g., 0.5-1 ML.

The present invention will be explained with reference to embodiments of the present invention.

A First Embodiment

Figure 5:
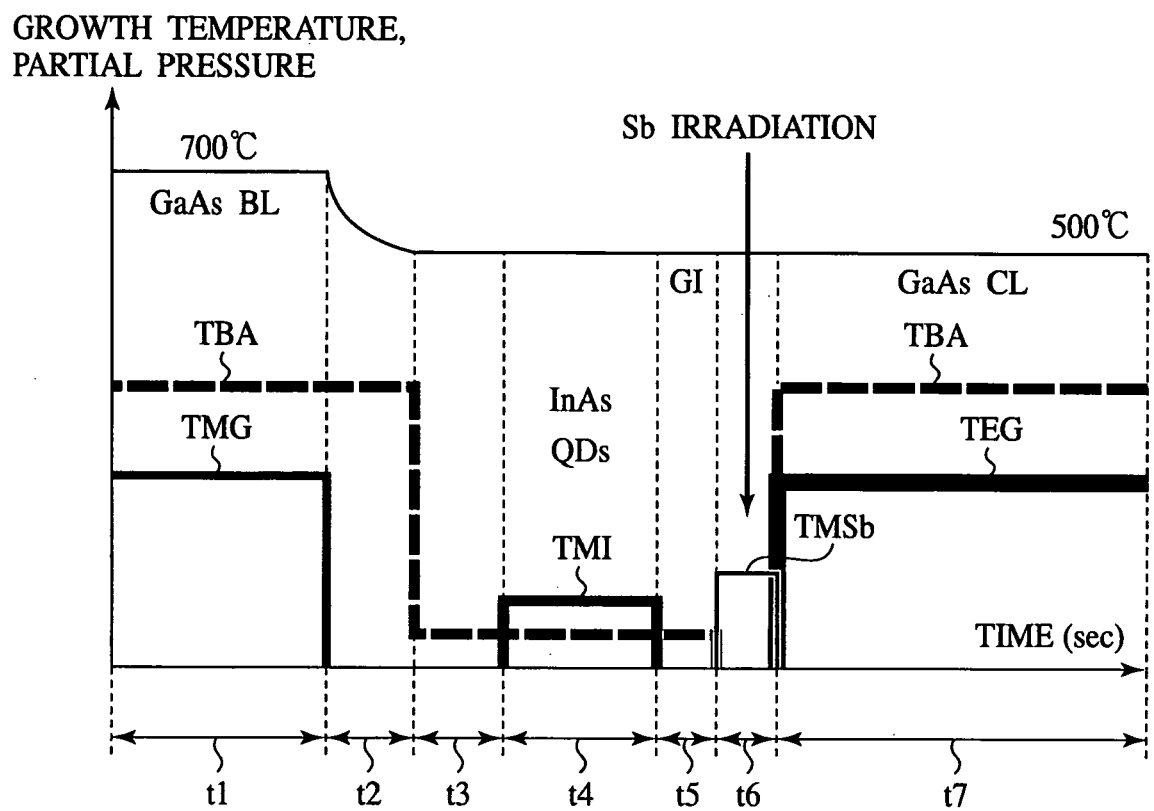
FIG. 5 is a graph of the partial pressures of the raw material gases to be fed, etc. in the method of manufacturing the semiconductor device according to a first embodiment of the present invention.

The method of manufacturing the semiconductor device according to a first embodiment of the present invention will be explained with reference to FIGS. 5 to 7. FIG. 5 is a graph of the partial pressures of the raw material gases to be fed, etc.

in the method of manufacturing the semiconductor device according to the present embodiment. FIGS. 6A-6D are sectional views showing the steps of the method of manufacturing the semiconductor device according to the present embodiment. FIG. 7 is a graph of PL emission spectra of the quantum dots at the room temperature with Sb irradiation after the quantum dots have been grown, etc.

In the method of manufacturing the semiconductor device according to the present embodiment, the crystal growth is made by metal organic chemical vapor deposition (MOCVD).

First, a GaAs substrate 26 is loaded into the reaction chamber of an MOCVD apparatus.

Figure 6A:
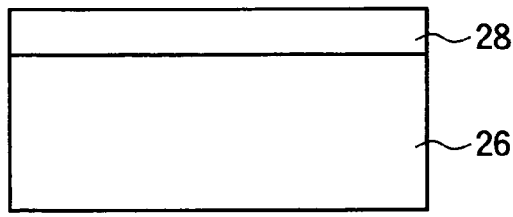
FIGS. 6A-6D are sectional views showing the steps of the method of manufacturing the semiconductor device according to the first embodiment of the present invention.

Then, with the substrate temperature set at, e.g., 700° C., TBA and TMG (trimethylgallium) are fed into the reaction chamber (at the time interval t1 in FIG. 5). Thus, a buffer layer 28 of GaAs is grown on the GaAs substrate 26 (FIG. 6A).

Then, the supply of the TMG is stopped, and the substrate temperature is lowered gradually to, e.g., 500° C. (at the time interval t2 in FIG. 5). Meanwhile, the supply of the TBA is set on.

Next, with the partial pressure of the TBA lowered, the supply of the TBA is continued (at the time interval t3 in FIG. 5). Meanwhile the substrate temperature is maintained at, e.g., 500° C.

Figure 6B:
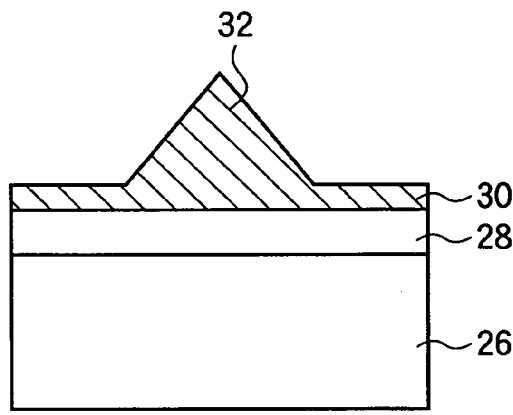

Then, with the substrate temperature maintained at, e.g., 500° C., the supply of the TBA is continued while TMI (trimethylindium) is fed into the reaction chamber (at the time interval t4 in FIG. 5). Thus, on the buffer layer 28, InAs of 2.64 ML is grown at, e.g., a 0.011 ML/s growth rate to thereby grow a quantum dot layer 30 of InAs. Because InAs, and GaAs forming the buffer layer 28 have lattice constants different from each other, quantum dots 32 are formed in the quantum dot layer 30 by the self-assembled growth called S-K mode (FIG. 6B).

Then, the supply of the TMI is stopped while the supply of the TBA is set on (at the time interval t5 in FIG. 5). Meanwhile, the substrate temperature is maintained at, e.g., 500° C.

Figure 6C:
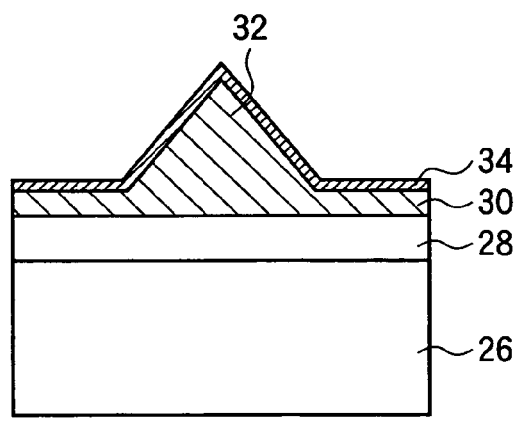

Then, with the substrate temperature maintained at, e.g., 500° C., the supply of the TBA is stopped, and TMSb (trimethylantimony) is fed into the reaction chamber (at the time interval t6 in FIG. 5). Thus, TMSb is irradiated to the surface of the quantum dot layer 30 to thereby form an Sb layer 34 on the surface of the quantum dot layer 30 (FIG. 6C).

Figure 6D:
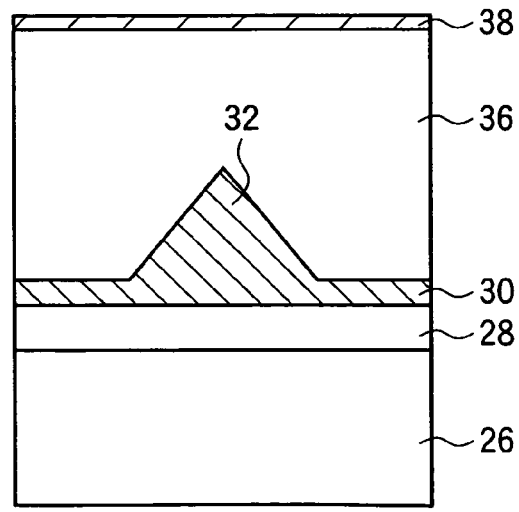

Then, with the substrate temperature maintained at, e.g., 500° C., the partial pressure is raised to resume the supply of the TBA while TEG (triethylgallium) is fed into the reaction chamber (at the time interval t7 in FIG. 5). Thus, on the quantum dot layer 30, a capping layer 36 of GaAs is grown, burying the quantum dots 32 (FIG. 6D).

While the capping layer 36 is growing, the Sb of the Sb layer 34 formed on the surface of the quantum dot layer 30 diffuses mutually with the As of GaAs forming the capping layer 36 to go on depositing on the surface of the capping layer 36. Thus, a GaSb layer 38 is formed on the surface of the capping layer 36.

The method of manufacturing the semiconductor device according to the present embodiment is characterized by the step of irradiating TMSb to the surface of the quantum dot layer 30 after the step of growing the quantum dot layer 30 and before the step of growing the capping layer 36.

Because the surfaces of the quantum dots 32 are coated with the Sb layer 34 formed by irradiating TMSb, the configuration of the quantum dots 32 can be retained in the step of growing the capping layer 36. Thus, the emission wavelength of the quantum dots 32 can be made longer.

Figure 7:
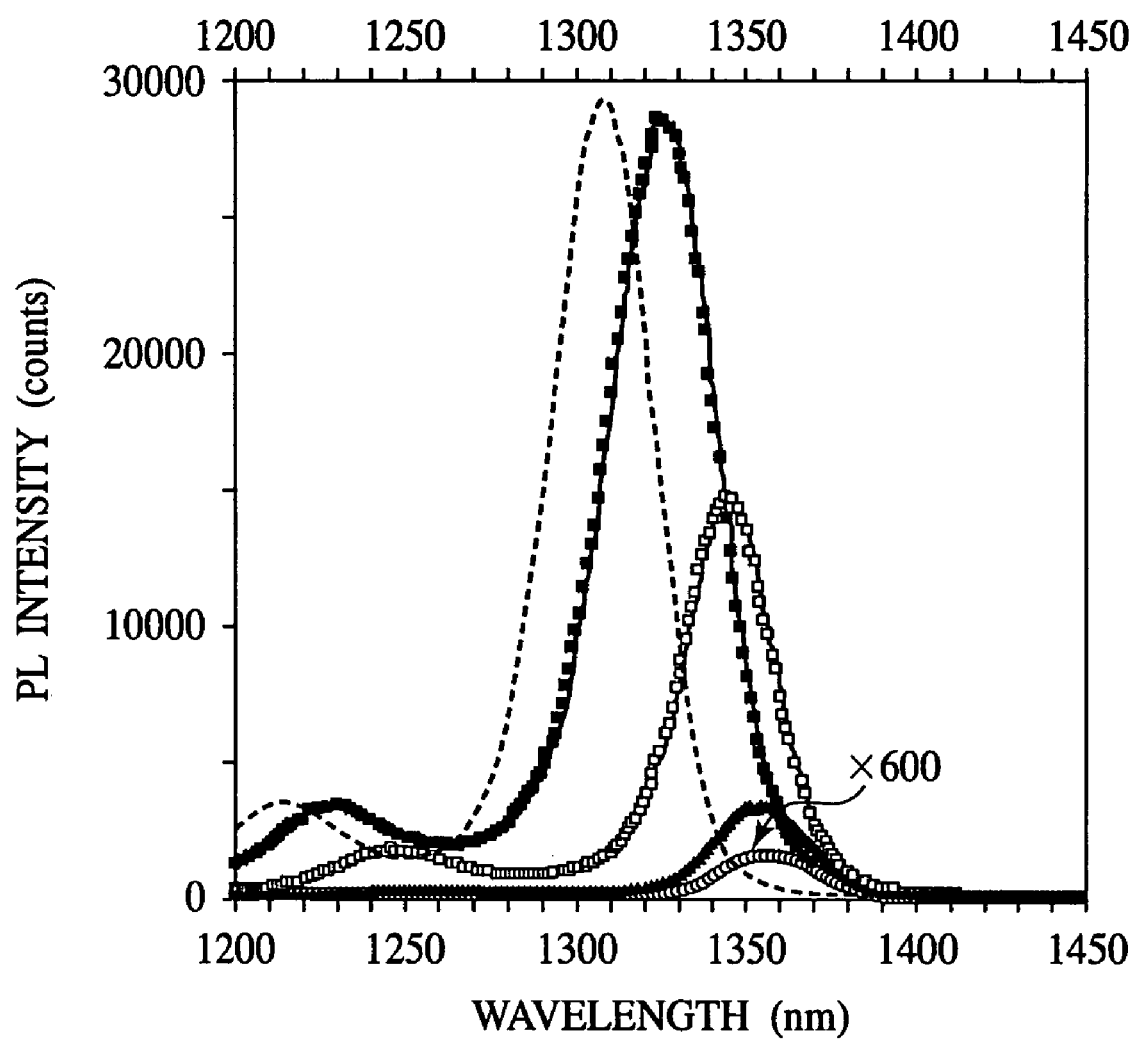
FIG. 7 is a graph of PL emission spectra of the quantum dots at the room temperature with Sb irradiation after the quantum dots have been grown, etc.

FIG. 7 is a graph of PL emission spectra of the quantum dots at the room temperature with Sb irradiation after the quantum dots have been grown, etc. In the graph, the spectrum indicated by the .tangle-solidup. marks is the PL emission spectrum of the sample prepared with a 2 seconds irradiation period of time of TMSb and a 0.1375 nm/s growth rate of the capping layer of GaAs. The spectrum indicated by the 0 marks is the PL emission spectrum of the sample prepared with a 2 seconds irradiation period of time of TMSb and a 0.275 nm/s growth rate of the capping layer of GaAs. The broken line indicates the spectrum of the PL emission spectrum of a control sample prepared without the irradiation of TMSb and with a 0.275 nm/s growth rate of the capping layer of GaAs. In all the samples, the quantum dots were formed by growing InAs of 2.64 ML at a 0.011 ML/s growth rate. The spectra indicated by the □ marks and the .box-solid. marks will be explained respectively in a second embodiment.

As evident from the spectra shown in FIG. 7, it can be seen that in the samples with TMSb irradiated after the growth of the quantum dots, the emission wavelength of the quantum dots is shifted to the longer wavelength side in comparison with that of the control sample. Specifically, the peak emission wavelength of the control sample is 1.308 μm. In contrast to this, the peak emission wavelength of the samples with TMSb irradiated after the growth of the quantum dots is 1.357 μm for either of the 0.1375 nm/s capping layer growth rate and the 0.275 nm/s capping layer growth rate. However, the samples with TMSb irradiated have the emission intensity lowered in comparison with that of the control sample. Among the samples with TMSb irradiated, the sample with the higher growth rate of the capping layer has the emission intensity more lowered.

As described above, according to the present embodiment, the Sb layer 34 coating the surfaces of the quantum dot 32 is formed by irradiating TMSb to the surface of the quantum dot layer 30 after the step of growing the quantum dot layer 30 and before the step of growing the capping layer 36, whereby the configuration of the quantum dots 32 can be retained, and the emission wavelength of the quantum dots 32 can be made longer.

A Second Embodiment

Figure 8:
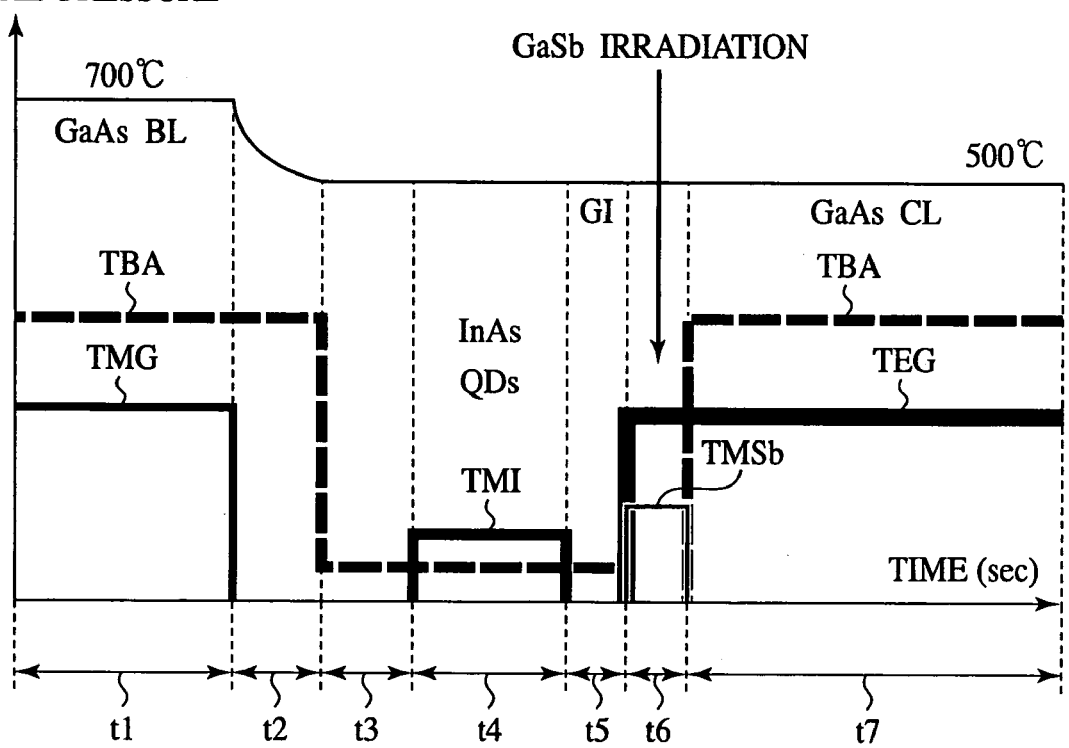
FIG. 8 is a graph of the partial pressures of the raw material gases to be fed, etc. in the method of manufacturing the semiconductor device according to a second embodiment of the present invention.
Figure 9A:
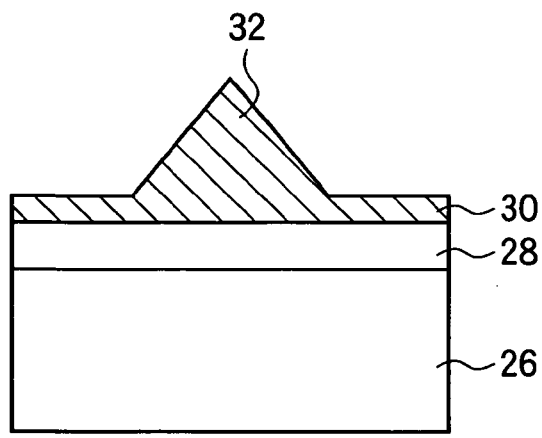
FIGS. 9A-9C are sectional views showing the steps of the method of manufacturing the semiconductor device according to the second embodiment of the present invention.
Figure 9B:
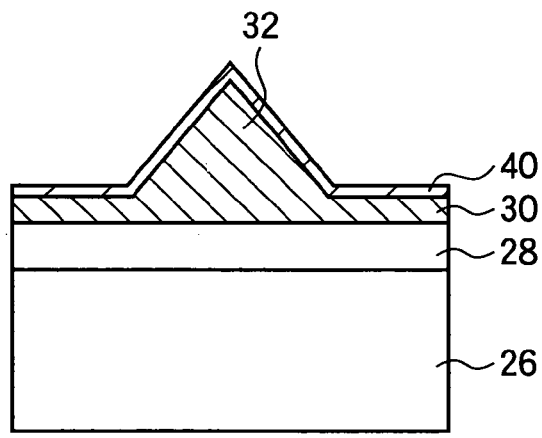
Figure 9C:
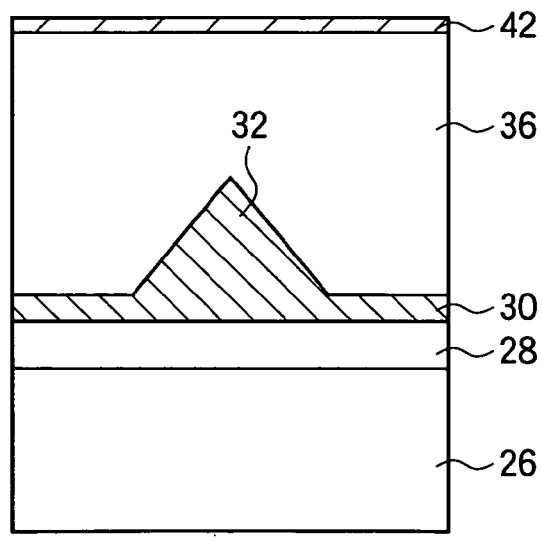

The method of manufacturing the semiconductor device according to a second embodiment of the present invention will be explained with reference to FIGS. 7 to 9C. FIG. 8 is a graph of the partial pressures of the raw material gases to be fed, etc. in the method of manufacturing the semiconductor device according to the present embodiment. FIGS. 9A-9C are sectional views showing the steps of the method of manufacturing the semiconductor device according to the present embodiment. The same members of the present embodiment as those of the method of manufacturing the semiconductor device according to the first embodiment will be represented by the same reference numbers not to repeat or to simplify their explanation.

The method of manufacturing the semiconductor device according to the present embodiment is substantially the same as the method of manufacturing the semiconductor device according to the first embodiment. The method of manufacturing the semiconductor device according to the present embodiment is different in that TMSb and TEG are concurrently irradiated to the surface of a quantum dot layer 30 from the method of manufacturing the semiconductor device according to the first embodiment, in which TMSb alone is irradiated.

First, in the same way as in the method of manufacturing the semiconductor device according to the first embodiment, a buffer layer 28 of GaAs, a quantum dot layer 30 of InAs are grown on a GaAs substrate 26 (at the time intervals t1-t4 in FIG. 8, FIG. 9A).

Then, the supply of TMI is stopped while the supply of TBA is set on (at the time interval t5 in FIG. 8). Meanwhile the substrate temperature is maintained at, e.g., 500° C.

Then, with the substrate temperature maintained at, e.g., 500° C., the supply of TBA is stopped, and TMSb and TEG are fed into the reaction chamber (at the time interval t6 in FIG. 8). Thus, TMSb and TEG are concurrently irradiated to the surface of the quantum dot layer 30 to thereby form a GaSb layer 40 on the surface of the quantum dot layer 30 (FIG. 9B).

Next, with the substrate temperature maintained at, e.g., 500° C., the partial pressure is raised to resume the supply of TBA while the supply of TEG is continued (at the time interval t7 in FIG. 8). Thus, on the quantum dot layer 30, a capping layer 36 of GaAs is grown, burying the quantum dots 32 (FIG. 9C).

While the capping layer 36 is growing, the Sb of the GaSb layer 40 formed on the surface of the quantum dot layer 30 diffuses mutually with the As of GaAs forming the capping layer 36 to thereby go on depositing on the surface of the capping layer 36. Thus, a GaSb layer 42 is formed on the surface of the capping layer 36.

The method of manufacturing the semiconductor device according to the present embodiment is characterized by the step of irradiating TMSb and TEG concurrently to the surface of the quantum dot layer 30 after the step of growing the quantum dot layer 30 and before the step of growing the capping layer 36.

Because the surfaces of the quantum dots 32 are coated with the GaSb layer 40 formed by irradiating TMSb and TEG concurrently, the configuration of the quantum dots 32 can be retained in the step of growing the capping layer 36 Thus, the emission wavelength of the quantum dots 32 can be made longer.

FIG. 7 shows the PL emission spectra of the quantum dots at the room temperature with TMSb and TEG concurrently irradiated after the quantum dots have been grown. In the graph, the spectrum indicated by the .quadrature. marks is the PL emission spectrum of the sample prepared with a 2 seconds irradiation period of time of TMSb and TEG and a 0.275 nm/s growth rate of the capping layer of GaAs. The spectrum indicated by the .box-solid. marks is the PL emission spectrum of the sample prepared with a 2 seconds irradiation period of time of TMSb and TEG and a 0.1375 nm/s growth rate of the capping layer of GaAs. In these samples, the quantum dots were formed by growing InAs of 2.64 ML at a 0.011 ML/s growth rate.

As evident from the spectra shown in FIG. 7, it can be seen that the sample prepared with TMSb and TEG concurrently irradiated after the quantum dots have been grown as the samples prepared with TMSb alone irradiated have the emission wavelength of the quantum dots shifted to the longer wavelength side in comparison with that of the control sample. Specifically, the peak emission wavelength of the samples with TMSb and TEG irradiated after the growth of the quantum dots is 1.326 μm for the 0.1375 nm/s capping layer growth rate and 1.344 μm for the 0.275 nm/s capping layer growth rate. In comparison with the samples with TMSb alone irradiated, the samples with TMSb and TEG concurrently irradiated have the emission wavelength shifted to the shorter wavelength side but have high emission intensities. For the 0.1375 nm/s capping layer growth rate, the substantially the same emission intensity as that of the control sample is achieved.

As described above, according to the present embodiment, the GaSb layer 40 coating the surfaces of the quantum dots 32 is formed by concurrently irradiating TMSb and TEG to the surface of the quantum dot layer 30 after the step of growing the quantum dot layer 30 and before the step of growing the capping layer 36, whereby the configuration of the quantum dots 32 can be retained, and the emission wavelength of the quantum dots 32 can be made longer. The present embodiment can provide higher emission intensity than the method of manufacturing the semiconductor device according to the first embodiment.

The semiconductor device manufactured by the method of manufacturing the semiconductor device according to the present embodiment has the following structure characteristic in the interface between the quantum dot layer 30 and the capping layer 36.

That is, even when the capping layer 36 is grown at low growth rate, the GaSb layer 40 between the quantum dot layer 30 and the capping layer 36 is not often removed completely. In such case, thin film of GaSb remains between the quantum dot layer 30 and the capping layer 36.

A Third Embodiment

Figure 10:
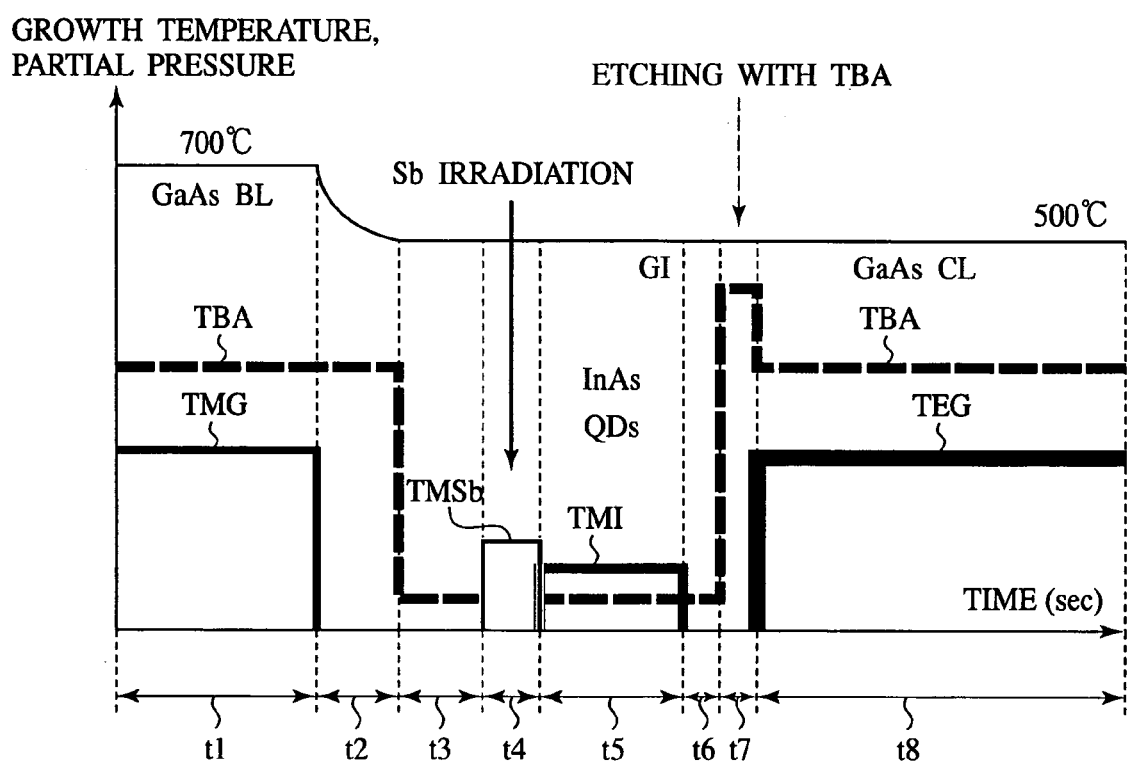
FIG. 10 is a graph of the partial pressures of the raw material gases to be fed, etc. in the method of manufacturing the semiconductor device according to a third embodiment of the present invention.
Figure 11A:
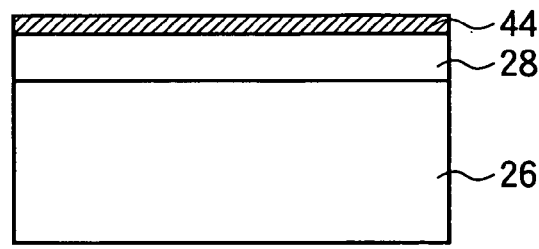
FIGS. 11A-11C and 12A-12C are sectional views showing the steps of the method of manufacturing the semiconductor device according to the third embodiment of the present invention.
Figure 11B:
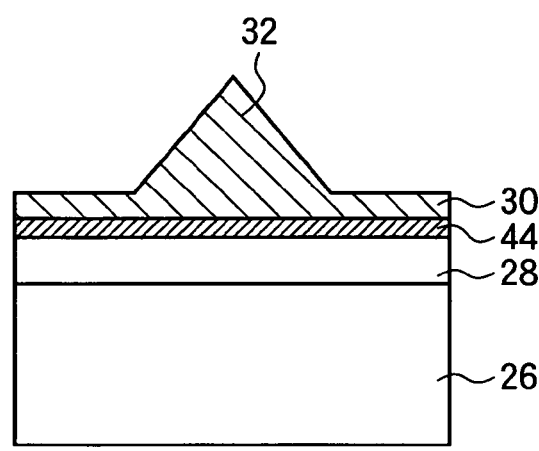
Figure 11C:
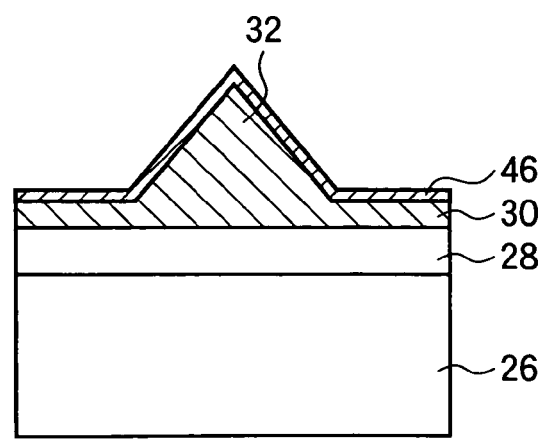
Figure 12A:
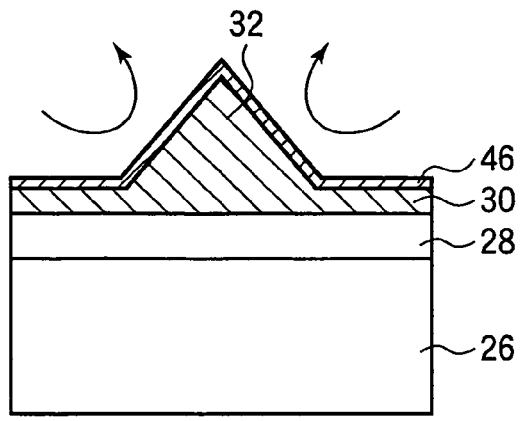
Figure 12B:
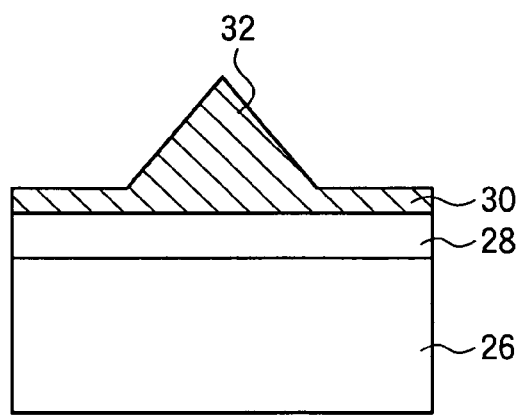
Figure 12C:
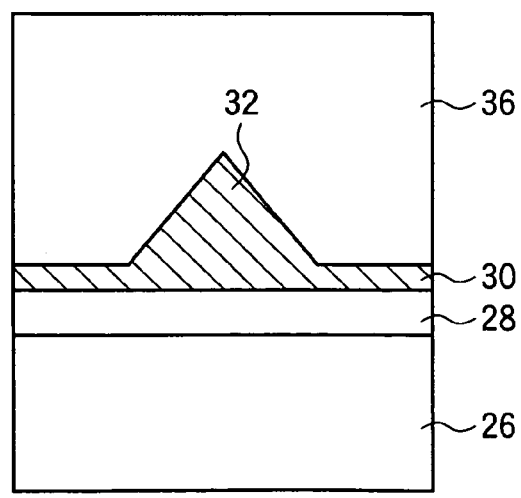
Figure 13:
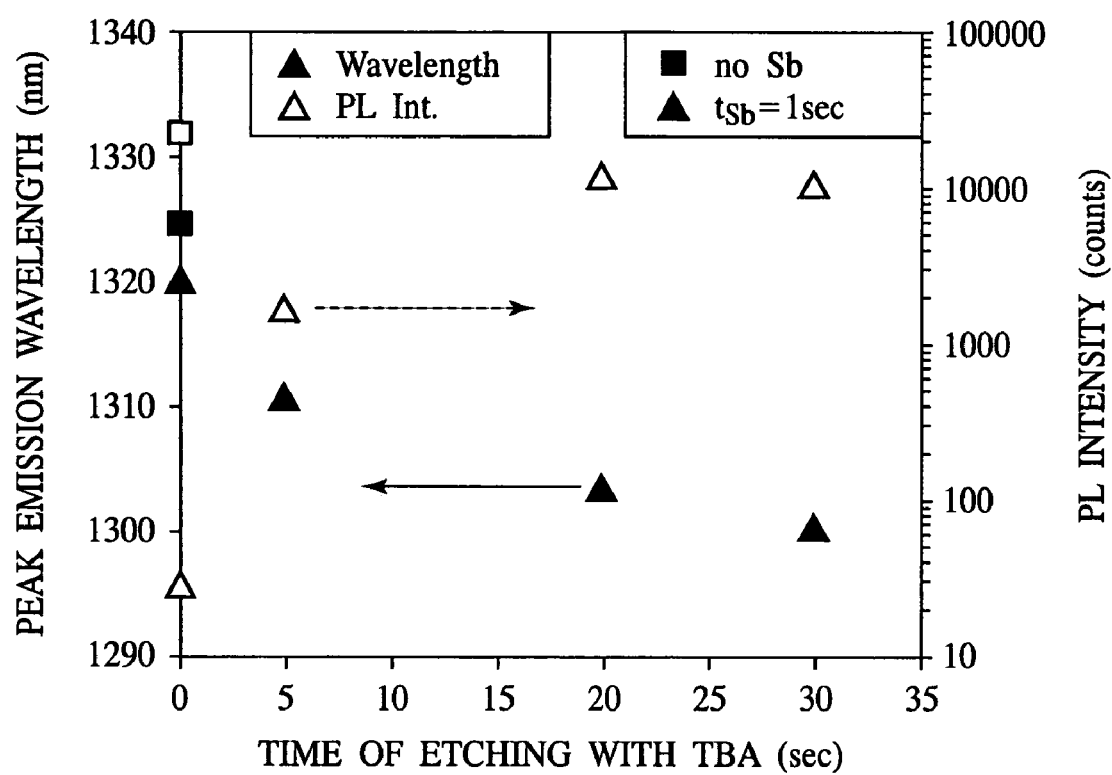
FIG. 13 is a graph of the relationships between the peak emission wavelength and the emission intensity of the quantum dots and the time of etching with TBA.

The method of manufacturing the semiconductor device according to a third embodiment of the present invention will be explained with reference to FIGS. 10 to 13. FIG. 10 is a graph of the partial pressures of the raw material gases to be fed, etc. in the method of manufacturing the semiconductor device according to the present embodiment. FIGS. 11A-11C and 12A-12C are sectional views showing the steps of the method of manufacturing the semiconductor device according to the present embodiment. FIG. 13 is a graph of the relationships between the peak emission wavelength and the emission intensity of the quantum dots and the time of etching with TBA. The same members of the present embodiment as those of the method of manufacturing the semiconductor device according to the first embodiment are represented by the same reference numbers not to repeat or to simplify their explanation.

The method of manufacturing the semiconductor device according to the present embodiment is characterized mainly in that the method of manufacturing the semiconductor device comprising the step of irradiating TMSb to the surface of a buffer layer 28 before the step of growing a quantum dot layer 30 comprises, after the step of growing the quantum dot layer 30 and before the step of growing a capping layer 36, the step of irradiating TBA for a prescribed period of time to the surface of the quantum dot layer 30 and etching the surface of the quantum dot layer 30 with TBA.

First, in the same way as in the method of manufacturing the semiconductor device according to the first embodiment, a buffer layer 28 of GaAs is grown on a GaAs substrate 26 (at the time interval t1 in FIG. 10).

Next, the supply of TMG is stopped, and the substrate temperature is lowered gradually to, e.g., in the range from 470° C. to 520° C. (at the time interval t2 in FIG. 10). Meanwhile the supply of TBA is set on.

Then, the partial pressure of TBA is lowered, and the supply of TBA is set on (at the time interval t3 in FIG. 10). Meanwhile, the substrate temperature is maintained at, e.g., 500° C.

Then, with the substrate temperature maintained at, e.g., 500° C., the supply of TBA is stopped, and TMSb is fed into the reaction chamber (at time interval t4 in FIG. 10). Thus, TMSb is irradiated to the surface of the buffer layer 28 to thereby form an Sb layer 44 of, e.g., an about 1 ML is formed on the surface of the buffer layer 28 (FIG. 11A). Because TMSb is irradiated to the surface of the buffer layer 28 before the quantum dots are grown, the quantum dots can be grown in a high density than, e.g., $5 \times 10^{10}$ cm$^{-2}$.

Next, with the substrate temperature maintained at, e.g., 500° C., the supply of TBA is resumed, and TMI is fed into the reaction chamber (at time interval t5 in FIG. 10). Thus, a quantum dot layer 30 of InAs is formed on the buffer layer 28. Because InAs, and GaAs of the buffer layer 28 have lattice constants different from each other, the quantum dots 32 are formed in the quantum dot layer 30 by S-K mode (FIG. 11B).

While the quantum dot layer 30 is growing, the Sb on the surface of the buffer layer 28 diffuses mutually with the As of InAs forming the quantum dot layer 30 to go on depositing on the surface of the quantum dot layer 30. Thus, on the surface of the quantum dot layer 30, an InSb or InAsSb layer 46 is formed (FIG. 1C).

Then, the supply of TMI is stopped while the supply of TBA is continued (at time interval t6 in FIG. 10). Meanwhile the substrate temperature is retained at, e.g., 500° C.

Next, the partial pressure is raised, and the supply of TBA is continued (at time interval t7 in FIG. 10). Thus, TBA is irradiated for a prescribed period of time to the surface of the quantum dot layer 30 with the InSb layer 46 formed on to thereby etch the surface of the quantum dot layer with TBA (FIG. 12A). Thus, the InSb layer 46 on the surface of the quantum dot layer 30 is removed (FIG. 12B).

As described above, the method of manufacturing the semiconductor device according to the present embodiment is characterized mainly in that TBA is irradiated for a prescribed period of time to the surface of the quantum dot layer 30 with the InSb layer 46 formed on to thereby etch the surface of the quantum dot layer 30 with TBA. Because the InSb layer 46 is removed by the etching with TBA, the defects of the quantum dots 32 are decreased, and the crystal quality of the quantum dots 32 can be improved.

Next, with the substrate temperature maintained at, e.g., 500° C., the partial pressure is lowered, and the supply of TBA is continued while TEG is fed into the reaction chamber (at time interval t8 in FIG. 10). Thus, on the quantum dot layer 30, a capping layer 36 of GaAs is grown, burying the quantum dots 32 (FIG. 12C).

FIG. 13 is a graph of the relationships between the peak emission wavelength and the emission intensity of the quantum dots and the time of etching with TBA. The time of etching with TBA is taken on the horizontal axis of the graph. The peak emission wavelength is taken on the left vertical axis of the graph, and the emission intensity is taken on the right vertical axis. The ▲ marked plots and the △ marked plots respectively indicate the peak emission wavelength and the emission intensity of the quantum dots of a sample subjected to a 1 second irradiation period of time of TMSb before the growth of the quantum dots. The ■ marked plots and the □ marked plots respectively indicate the peak emission wavelength and the emission intensity of the quantum dots of a control sample subjected to no TMSb irradiation before the growth of the quantum dots. The growth rate of the capping layer was 0.55 nm/s commonly for the respective samples.

As shown in FIG. 13, without the etching with TBA, the samples subjected to the TMSb irradiation before the growth of the quantum dots has the emission intensity of the quantum dots, which is as low as about 1/300 that of the control sample. When the sample subjected to such TMSb irradiation is etched with TBA, the emission intensity of the quantum dots increases as the time of the etching with TBA is longer. When the etching with TBA is made for 20 seconds or more, the emission intensity of the quantum dots is increased up to about 1/2 that of the control sample.

Because of the emission intensity increase by the etching with TBA, the defects due to the Sb deposited on the surface of the quantum dots will be decreased, and the crystal quality of the quantum dots will be improved.

As described above, according to the present embodiment, in the method of manufacturing the semiconductor device comprising the step of irradiating TMSb to the surface of the buffer layer 28 before the step of growing the quantum dots 30, TBA is irradiated to the surface of the quantum dot layer 30 for a prescribed period of time to etch the surface of the quantum dot layer 30 with TBA after the step of growing the quantum dots 32 and before the step of growing the capping layer 36 to thereby remove the InSb layer 46, whereby the quantum dots 32 of high crystal quality can be densely formed.

A Fourth Embodiment

Figure 14:
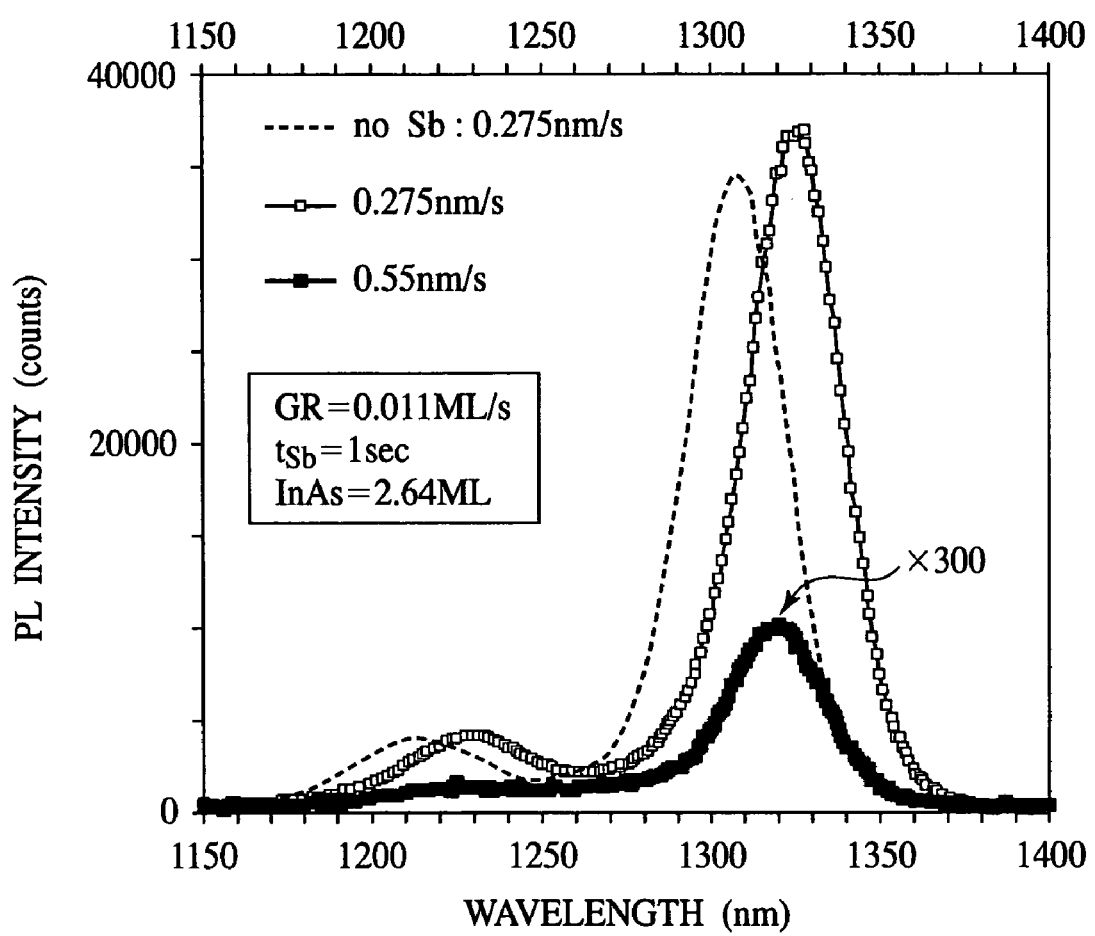
FIG. 14 is a graph of PL emission spectra of the quantum dots at the room temperature of samples which are different from each other in the growth rate of the capping layer.
Figure 15A:
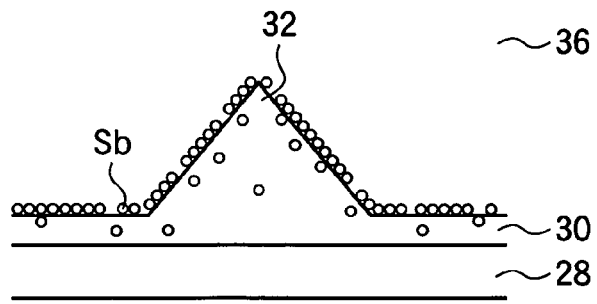
FIGS. 15A-15C are diagrammatic sectional views explaining the diffusion of Sb in the method of manufacturing the semiconductor device according to a fourth embodiment of the present invention.
Figure 15B:
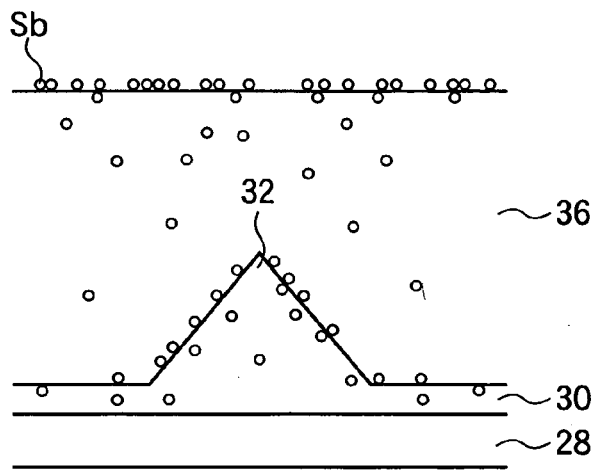
Figure 15C:
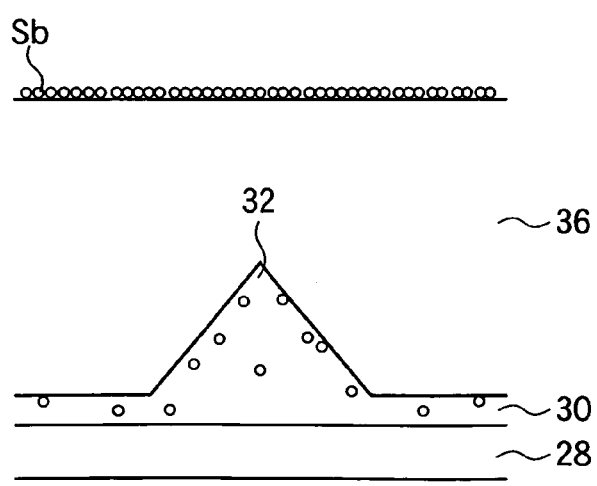

The method of manufacturing the semiconductor device according to a fourth embodiment of the present invention will be explained with reference to FIGS. 14 and 15A-15C. FIG. 14 is a graph of PL emission spectra of the quantum dots at the room temperature of samples which are different from each other in the growth rate of the capping layer. FIGS. 15A-15C are diagrammatic sectional views explaining the diffusion of Sb in the method of manufacturing the semiconductor device according to the present embodiment. The same members of the present embodiment as those of the method of manufacturing the semiconductor device according to the first embodiment are represented by the same reference numbers not to repeat or to simplify their explanation.

The method of manufacturing the semiconductor device according to the present embodiment is characterized mainly in that in the step of growing a capping layer 36 after a quantum dot layer 30 has been grown, the capping layer 36 is grown at a growth rate sufficient for the Sb on the surface of the quantum dot layer 30 to diffuse on the uppermost surface of the capping layer 36, specifically at a growth rate of below 0.275 nm/s including 0.275 nm/s.

FIG. 14 is a graph of PL emission spectra of the quantum dots at the room temperature of samples which are different from each other in the growth rate of the capping layer The samples used in the PL emission spectrum measurement each have a capping layer of GaAs grown on quantum dots having Sb deposited on the surfaces. The quantum dots were formed by growing InAs of 2.64 ML at a 0.011 ML/s growth rate on a buffer layer of GaAs having the surface with TMSb irradiated to the surface for 1 second. As a control sample, a sample having the quantum dots formed without irradiating TMSb to the surface of the bugger layer was prepared.

In the graph, the spectrum indicated by the □ mark is the PL emission spectrum of the sample having the capping layer grown at a 0.275 nm/s growth rate on the quantum dots with Sb deposited on the surfaces. The spectrum indicated by the ■ mark is the PL emission spectrum of the sample having the capping layer grown at a 0.55 nm/s growth rate on the quantum dots with Sb deposited on the surfaces. The spectrum indicated by the broken line is the PL emission spectrum of the control sample having the capping layer grown at a 0.275 nm/s growth rate on the quantum dots.

As evident from FIG. 14, the samples having the capping layer grown at a 0.55 nm/s growth rate on the quantum dots with Sb deposited on the surfaces has the emission wavelength shifted to the longer wavelength side in comparison with the control sample. However, the emission intensity is about 1/900 that of the control sample.

In contrast to this, the sample having the capping layer grown at a lowered growth rate to be grown at a 0.275 nm/s growth rate on the quantum dots with Sb deposited on the surfaces has the emission intensity increased to substantially the same or more of the control sample, whose growth rate of the capping layer is the same. The emission wavelength of the sample remains shifted to the longer wavelength side in comparison with that of the control sample.

The above-described results will be due to that the diffusion of the Sb on the surfaces of the quantum dots is considered to be influenced by the growth rate of the capping layer.

FIG. 15A is a diagrammatic sectional view illustrating the state of the Sb with the capping layer grown at a 0.55 nm/s growth rate.

When the growth rate of the capping layer 36 is 0.55 nm/s, the Sb on the surfaces of the quantum dots 32 cannot efficiently diffuse mutually with the As of GaAs forming the capping layer 36 because of the high growth rate. The Sb remains on the surfaces of the quantum dots 32.

Such mutual diffusion between the Sb and the As depressed when the growth rate of the capping layer 36 is low is accelerated by lowering the growth rate of the capping layer 36.

When the growth rate of the capping layer is 0.275 nm/s, the Sb will have diffused to the upper most surface of the capping layer 36. In such case, the Sb has the state illustrated in FIG. 15B or FIG. 15C. FIGS. 15B and 15C are diagrammatic sectional views of the Sb illustrating the states of the Sb when the capping layer was grown at a 0.275 nm/s growth rate.

First, as illustrated in FIG. 15B, the state that the Sb diffused to the uppermost surface of the capping layer 36 and the Sb remaining in the capping layer 36 are mixed is considered.

Otherwise, as illustrated in FIG. 15C, the state that the Sb completely diffused to the uppermost surface of the capping layer 36 is considered.

Thus, the capping layer 36 is grown at a growth rate of below 0.275 nm/s including 0.275 nm/s, whereby the Sb of the surfaces of the quantum dots 32 diffuses to the uppermost surface of the capping layer 36. Thus the crystal quality of the quantum dots 32 can be improved, and the high emission intensity can be realized.

In the method of manufacturing the semiconductor device according to the present embodiment, in the step of growing a capping layer 36 after a quantum dot layer 30 has been grown, the capping layer 36 is grown at a growth rate of below 0.275 nm/s including 0.275 nm/s which is sufficient for the Sb on the surfaces of the quantum dot 32 to diffuse on the uppermost surface of the capping layer 36, whereby the crystal quality of the quantum dots 32 can be improved, and the high emission intensity can be realized.

Also in the method of manufacturing the semiconductor device according to the first and the second embodiments, as described above, the capping layer 36 may be grown at a growth rate of below 0.275 nm/s including 0.275 nm/s. This improves the crystal quality of the quantum dots 32 and realizes the high emission intensity even when Sb or GaSb is irradiated to the surface of the quantum dot layer 30.

Also in the method of manufacturing the semiconductor device according to the third embodiment, as described above, the capping layer 36 may be grown at a growth rate of below 0.275 nm/s including 0.275 nm/s. Thus, the Sb of the surface of the quantum dot layer 30 can be more surely removed, and the crystal quality of the quantum dots 32 can be improved, and the high emission intensity can be realized.

A Fifth Embodiment

Figure 16:
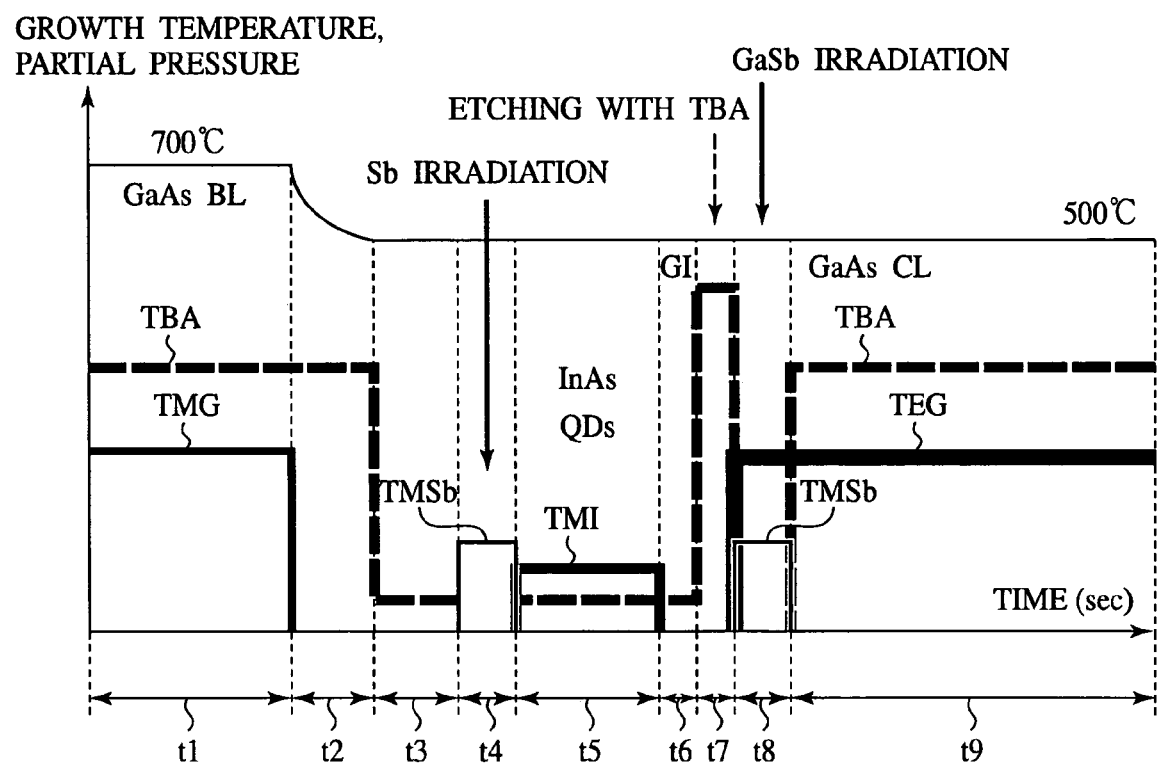
FIG. 16 is a graph of the partial pressures of the raw material gases to be fed, etc. in the method of manufacturing the semiconductor device according to a fifth embodiment of the present invention.

The method of manufacturing the semiconductor device according to a fifth embodiment of the present invention will be explained with reference to FIGS. 16 to 18C. FIG. 16 is a graph of the partial pressures of the raw material gases to be fed, etc. in the method of manufacturing the semiconductor device according to the present embodiment. FIGS. 17A-17D and 18A-18C are sectional views showing the steps of the method of manufacturing the semiconductor device according to the present embodiment. The same members of the present embodiment as those of the method of manufacturing the semiconductor device according to the first to the fourth embodiments are represented by the same reference numbers not to repeat or to simplify their explanation.

The method of manufacturing the semiconductor device according to the present embodiment is the method of manufacturing the semiconductor device according to the third embodiment comprising, after the step of irradiating TBA for a prescribed period of time and before the step of growing a capping layer 36 the step of irradiating GaSb to the surfaces of quantum dots 32 as in the method of manufacturing the semiconductor device according to the second embodiment. Furthermore, in the step of growing the capping layer 36, the capping layer 36 is grown at a low growth rate, as in the method of manufacturing the semiconductor device according to the fourth embodiment.

First, in the same way as in the method of manufacturing the semiconductor device according to the first embodiment, a buffer layer 28 of GaAs is grown on a GaAs substrate 26 (at time interval t1 in FIG. 16).

Next, the supply of TMG is stopped, and the substrate temperature is lowered gradually to, e.g., 500° C. (at time interval t2 in FIG. 16). Meanwhile the supply of the TBA is set on.

Next, the partial pressure of TMG is lowered, and the supply of TBA is continued (at time interval t3 in FIG. 16). Meanwhile, the substrate temperature is maintained at, e.g., 500° C.

Figure 17A:
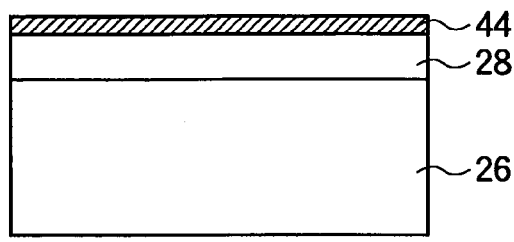
FIGS. 17A-17D and 18A-18C are sectional views showing the steps of the method of manufacturing the semiconductor device according to the fifth embodiment of the present invention.

Next, with the substrate temperature maintained at, e.g., 500° C., the supply of TBA is stopped and TMSb is fed into the reaction chamber (at time interval t4 in FIG. 16). Thus, TMSb is irradiated to the surface of the buffer layer 28 to thereby form an Sb layer 44 of, e.g., an about 1 ML on the surface of the buffer layer 28 (FIG. 17A). The irradiation of TMSb to the surface of the buffer layer 28 before the growth of quantum dots makes it possible to grow the quantum dots in, e.g., a density higher than $5 \times 10^{10}$ cm$^{-2}$.

Figure 17B:
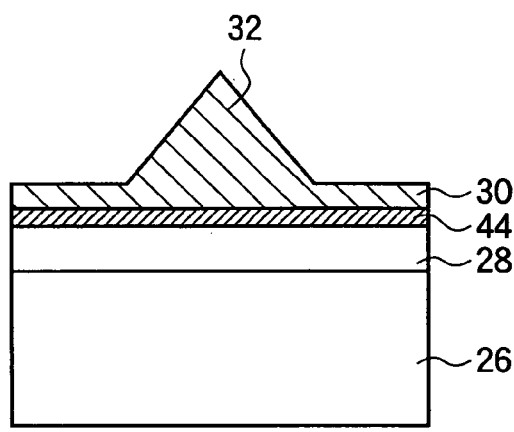

Next, with the substrate temperature maintained at, e.g., 500° C., the supply of TBA is resumed while the TMI is fed into the reaction chamber (at time interval t5 in FIG. 16). Thus, a quantum dot layer 30 of InAs is grown on the buffer layer 28. Because the lattice constant of InAS is different from that of GaAs forming the buffer layer 28, the quantum dots 32 are formed in the quantum dot layer 30 by S-K mode (FIG. 17B).

Figure 17C:
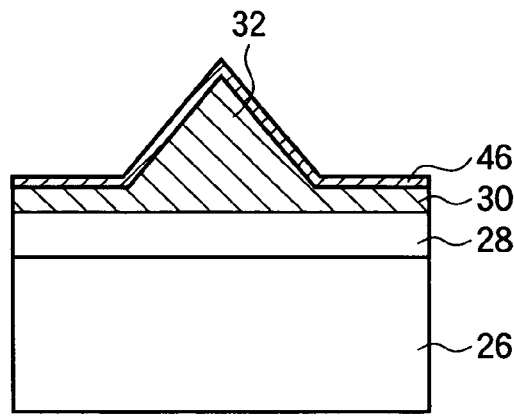

While the quantum dot layer 30 is growing, the Sb on the surface of the buffer layer 28 diffuses mutually with the As of InAs forming the quantum dot layer 30 to go on depositing on the surface of the quantum dot layer 30. Thus, an InSb layer 46 is formed on the surface of the quantum dot layer 30 (FIG. 17C).

Then, the supply of TMI is stopped while the supply of TBA is continued (at time interval t6 in FIG. 16). Meanwhile the substrate temperature is maintained at, e.g., 500° C.

Figure 17D:
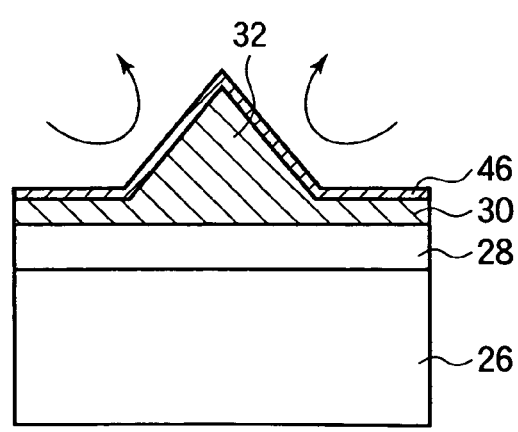
Figure 18A:
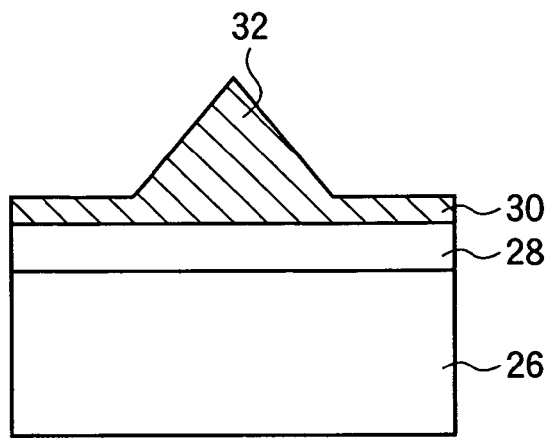

Then, the partial pressure is raised, and the supply of TBA is continued (at time interval t7 in FIG. 16). Thus, TBA is irradiated for a prescribed period of time to the surface of the quantum dot layer 30 with the InSb layer 46 formed on to thereby etch the surface of the quantum dot layer 30 with TBA (FIG. 17D). Thus, the InSb layer 46 on the surface of the quantum dot layer 30 is removed (FIG. 18A). Because the InSb layer 46 is removed by the etching with TBA as in the method of manufacturing the semiconductor device according to the third embodiment, defects of the quantum dots 32 can be decreased, and the crystal quality of the quantum dots 32 can be improved.

Figure 18B:
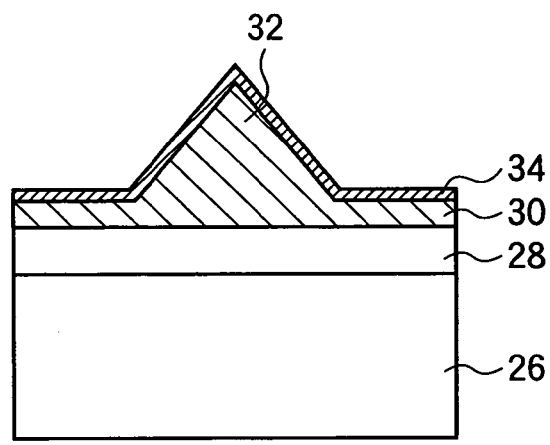

Next, with the substrate temperature maintained at, e.g., 500° C., the supply of TBA is stopped, and TMSb and TEG are fed into the reaction chamber (at time interval t8 in FIG. 16). Thus, TMSb and TEG are concurrently irradiated to the surface of the quantum dot layer 30 to thereby form a GaSb layer 40 on the surface of the quantum dot layer 30 (FIG. 18B). As in the method of manufacturing the semiconductor device according to the second embodiment, before the capping layer 36 is grown, TMSb and TEG are concurrently irradiated to the surface of the quantum dot layer 30, whereby the emission wavelength of the quantum dots 32 can be made longer, and high emission intensity can be obtained. TMSb alone may be irradiated as in the method of manufacturing the semiconductor device according to the first embodiment.

Figure 18C:
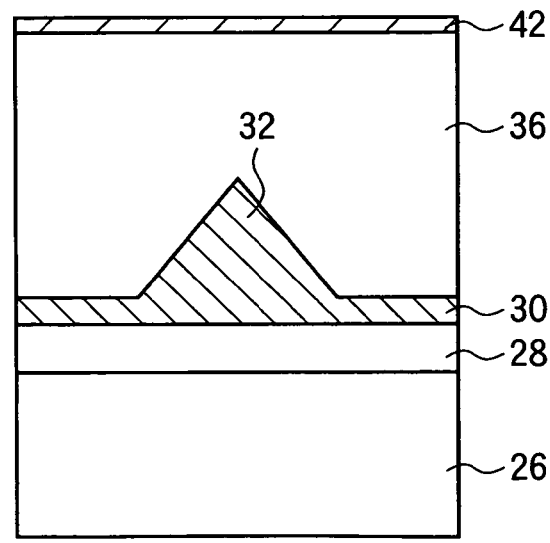

Next, with the substrate temperature maintained at, e.g., 500° C., the supply of TBA is resumed while the supply of TEG is continued (at time interval t9 in FIG. 16). Thus, on the quantum dot layer 30, a capping layer 36 of GaAs is grown, burying the quantum dots 32 (FIG. 18C).

While the capping layer 36 is growing, the Sb of the GaSb layer 40 formed on the surface of the quantum dot layer 30 diffuses mutually with the As of GaAs forming the capping layer 36 to go on depositing on the surface of the capping layer 36. Thus, a GaSb layer 42 is formed on the surface of the capping layer 36.

Here, as in the method of manufacturing the semiconductor device according to the fourth embodiment, the capping layer 36 is grown at a growth rate of, e.g., below 0.275 nm/s including 0.275 nm/s. The capping layer 36 is grown at a growth rate sufficient for the Sb on the surface of the quantum dots 32 to diffuse to the uppermost surface of the capping layer 36, whereby the crystal quality of the quantum dots 32 can be improved and the emission intensity can be high.

Thus, the quantum dots 32 of the semiconductor device manufactured by the method of manufacturing the semiconductor device according to the present embodiment has a density of, e.g., above $5 \times 10^{10}$ cm$^{-2}$ including $5 \times 10^{10}$ cm$^{-2}$ and a emission wavelength which is as long as, e.g., above 1.3 µm including 1.3 µm.

A Sixth Embodiment

Figure 19:
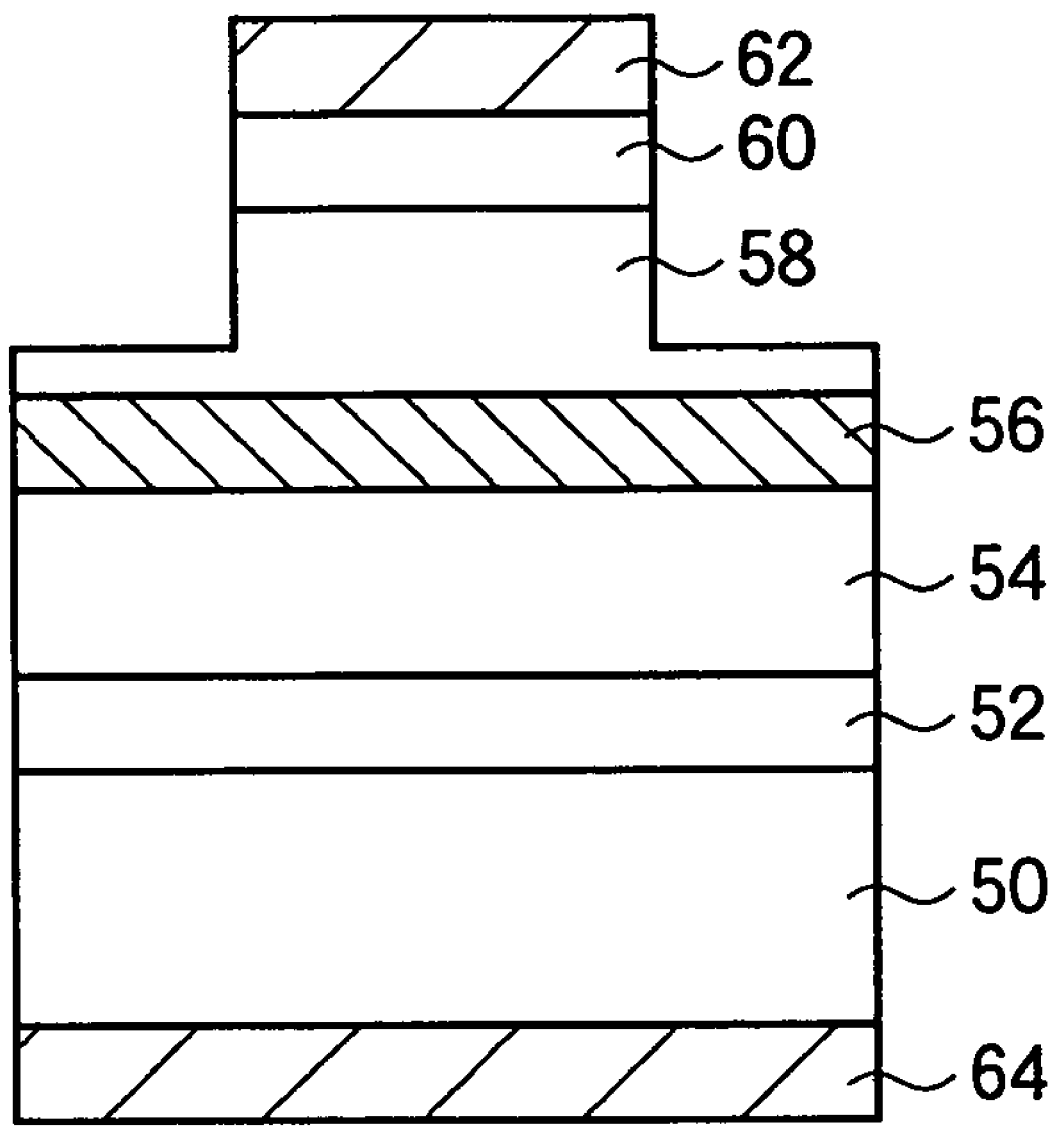
FIG. 19 is a sectional view showing the structure of the semiconductor device according to a sixth embodiment of the present invention.

The method of manufacturing the semiconductor device according to a sixth embodiment of the present invention will be explained with reference to FIGS. 19 to 21B. FIG. 19 is a sectional view showing the structure of the semiconductor device according to the present embodiment. FIGS. 20A-20C and 21A-21B are sectional views showing the steps of the method of manufacturing the semiconductor device according to the sixth embodiment of the present invention. The same members of the present embodiment as those of the method of manufacturing the semiconductor device according to the fifth embodiment are represented by the same reference numbers not to repeat or to simplify their explanation.

In the present embodiment, a ridge quantum dot laser including the active layer of the semiconductor laser using the quantum dots 32 grown by the method of manufacturing the semiconductor device according to the fifth embodiment will be explained.

On an n-type GaAs substrate 50, a buffer layer 52 of n-type GaAs of, e.g., a $1 \times 10^{18}$ cm$^{-3}$ impurity concentration is formed. The concentration of an n-type impurity implanted in the n-type GaAs substrate 50 is, e.g., $1\times10^{18}$ cm$^{-3}$. The concentration of an n-type impurity implanted in the buffer layer 52 is, e.g., $1\times10^{18}$ cm$^{-3}$.

On the buffer layer 52, a lower cladding layer 54 of n-type $Al_{0.3}Ga_{0.7}As$ is formed. The concentration of an n-type impurity implanted in the lower cladding layer 54 is, e.g., $5\times10^{17}$ cm$^{-3}$. The film thickness of the lower cladding layer 54 is, e.g., 3 μm.

On the lower cladding layer 54, an active layer 56 is formed. The film thickness of the active layer 56 is, e.g., 0.5 μm. The active layer 56 includes three layer films of the quantum dot layer 30 and the capping layer 36 grown by the method of manufacturing the semiconductor device according to the fifth embodiment, which are repeatedly formed. The pitch of the repeatedly formed quantum dot layers 30 is, e.g., 30 nm. The quantum dots 32 of each quantum dot layer 30 has a density of, e.g., above $5\times10^{10}$ cm$^{-2}$ including $5\times10^{10}$ cm$^{-2}$, specifically $7\times10^{10}$ cm$^{-2}$. The emission wavelength is as long as, e.g., above 1.3 μm including 1.3 μm.

On the active layer 56, an upper cladding layer 58 of p-type $Al_{0.3}Ga_{0.7}As$ is formed. The concentration of a p-type impurity implanted in the upper cladding layer 58 is $5\times10^{17}$ cm$^{-3}$. The film thickness of the upper cladding layer 58 is, e.g., 3 μm.

On the upper cladding layer 58, a contact layer 60 of p-type GaAs is formed. The concentration of a p-type impurity implanted in the contact layer 60 is, e.g., $1\times10^{19}$ cm$^{-3}$. The film thickness of the contact layer 60 is, e.g., 0.5 μm.

The contact layer 60 and the upper cladding layer 58 are processed in a stripe of, e.g., a 3 μm-width to form the ridge structure for stabilizing the transverse mode of the laser.

A p-side electrode 62 is formed on the contact layer 60.

An n-side electrode 64 is formed on the backside of the n-type GaAs substrate 50.

Thus, the semiconductor device according to the present embodiment is constituted.

The semiconductor device according to the present embodiment has three quantum dot layers 30 in the active layer 56, which are grown by the method of manufacturing the semiconductor device according to the fifth embodiment. The quantum dots 32 of each quantum dot layer 30 has a density of, e.g., above $5\times10^{10}$ cm$^{-2}$ including $5\times10^{10}$ cm$^{-2}$, specifically $7\times10^{10}$ cm$^{-2}$. Accordingly, the high-speed direct modulation of, e.g., 10 Gbps can be realized.

Next, the method of manufacturing the semiconductor device according to the present embodiment will be explained with reference to FIGS. 20A-20C and 21A-21B.

First, on the n-type GaAs substrate 10, the buffer layer 52 of n-type GaAs of, e.g., a $1\times10^{18}$ cm$^{-3}$ impurity concentration is grown by, e.g., MOCVD. The concentration of an n-type impurity implanted in the n-type GaAs substrate 50 is, e.g., $1\times10^{18}$ cm$^{-3}$. The concentration of an n-type impurity implanted in the buffer layer 52 is, e.g., $1\times10^{18}$ cm$^{-3}$.

Figure 20A:
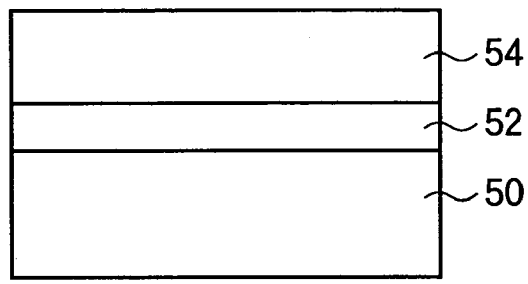
FIGS. 20A-20C and 21A-21B are sectional views showing the steps of the method of manufacturing the semiconductor device according to the sixth embodiment of the present invention.

Then, on the buffer layer 52, the lower cladding layer 54 of n-type $Al_{0.3}Ga_{0.7}As$ as is grown by, e.g., MOCVD (FIG. 20A). The concentration of an n-type impurity implanted into the lower cladding layer 54 is, e.g., $5\times10^{17}$ cm$^{-3}$. The film thickness of the lower cladding layer 54 is, e.g., 3 μm.

Then, on the lower cladding layer 54, the layer films of the quantum dot layer 30 and the capping layer 36 are formed repeatedly in three layers by the method of manufacturing the semiconductor device according to the fifth embodiment.

Here, on the surface of the capping layer 36 of the first layer, which is to be the base layer of the quantum dot layer 30 of the second layer, Sb deposits to form the GaSb layer 42. Accordingly, the step of irradiating TMSb to the surface of the capping layer 36 of the first layer before the quantum dot layer 30 of the second layer is grown may be omitted. The quantum dot layer 30 of the second layer may be grown after the GaSb layer 42 formed on the surface of the capping layer 36 of the first layer has been removed, and TMSb has been irradiated to the surface thereof.

Similarly, also on the surface of the capping layer 36 of the second layer, which is to be the base layer of the quantum dot layer 30 of the third layer, Sb deposits to form the GaSb layer 42. Accordingly, the step of irradiating TMSb to the surface of the capping layer 36 of the second layer before the quantum dot layer 30 of the third layer is grown may be omitted. The quantum dot layer 30 of the third layer may be grown after the GaSb layer 42 formed on the surface of the capping layer 36 of the second layer has been removed, and TMSb has been irradiated to the surface thereof.

Figure 20B:
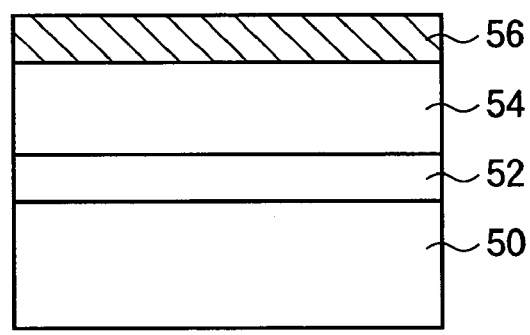

Thus, on the lower cladding layer 54, the active layer 54 is formed of the layer films of the quantum dot layer 30 and the capping layer 36 grown by the method of manufacturing the semiconductor device according to the fifth embodiment, which are repeatedly formed in three layers (FIG. 20B). The film thickness of the active layer 54 is, e.g., 0.5 μm. The film thickness of the capping layer 36 is suitably set so that the pitch of the quantum dot layers 30 is, e.g., 30 nm.

Then, on the active layer 56, the upper cladding layer 58 of p-type $Al_{0.3}Ga_{0.7}As$ is grown by, e.g., MOCVD. The concentration of a p-type impurity implanted in the upper cladding layer 58 is, e.g., $5\times10^{17}$ cm$^{-3}$. The film thickness of the upper cladding layer 58 is, e.g., 3 μm.

Figure 20C:
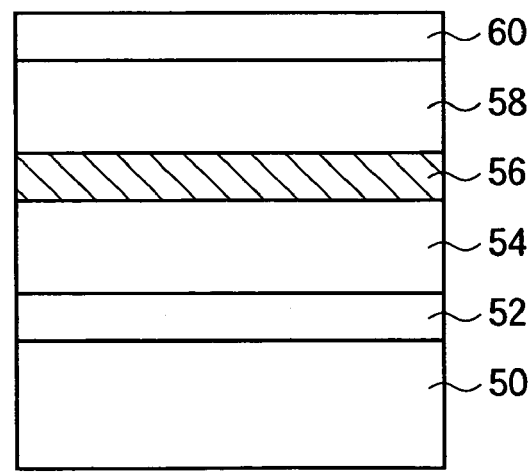

Then, on the upper cladding layer 58, the contact layer 60 of p-type GaAs is grown by, e.g., MOCVD (FIG. 20C). The concentration of a p-type impurity implanted in the contact layer 60 is, e.g., $1\times10^{19}$ cm$^{-3}$. The film thickness of the contact layer 60 is, e.g., 0.5 μm.

Figure 21A:
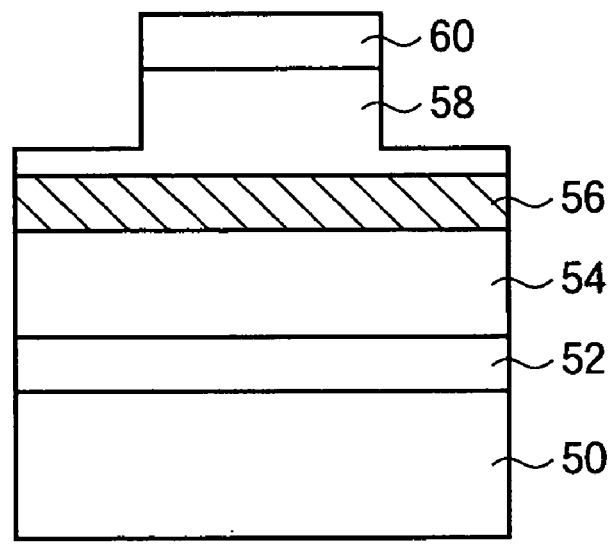

Next, the contact layer 60 and the upper cladding layer 58 are processed into a stripe of, e.g., a 3 μm-width, leaving about 100 nm of the upper cladding layer 58 on the active layer 56 (FIG. 21A).

Figure 21B:
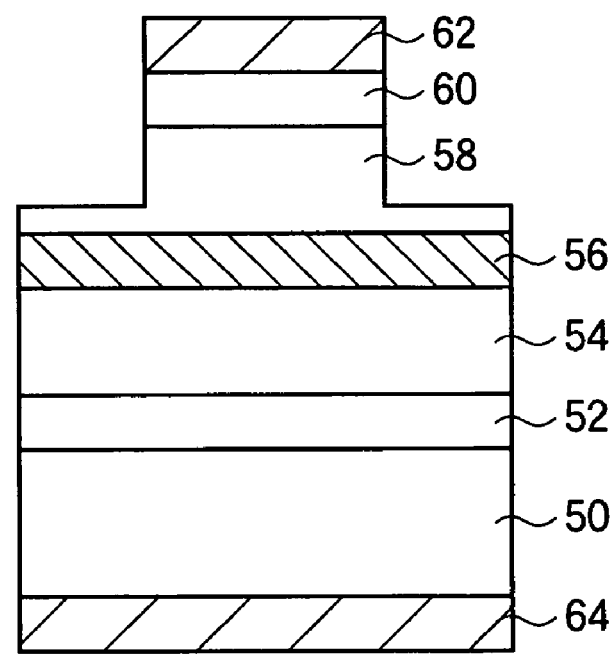

Next, the p-side electrode 62 is formed on the contact layer 60, and the n-side electrode 64 is formed on the backside of the GaAs substrate 50 (FIG. 21B).

Thus, the semiconductor device according to the present embodiment is manufactured.

As described above, according to the present embodiment, the quantum dots 32 grown by the method of manufacturing the semiconductor device according to the fifth embodiment are used in the active layer 56, whereby a quantum dot laser which can realize high-speed direct modulation can be provided.

A Seventh Embodiment

Figure 22A:
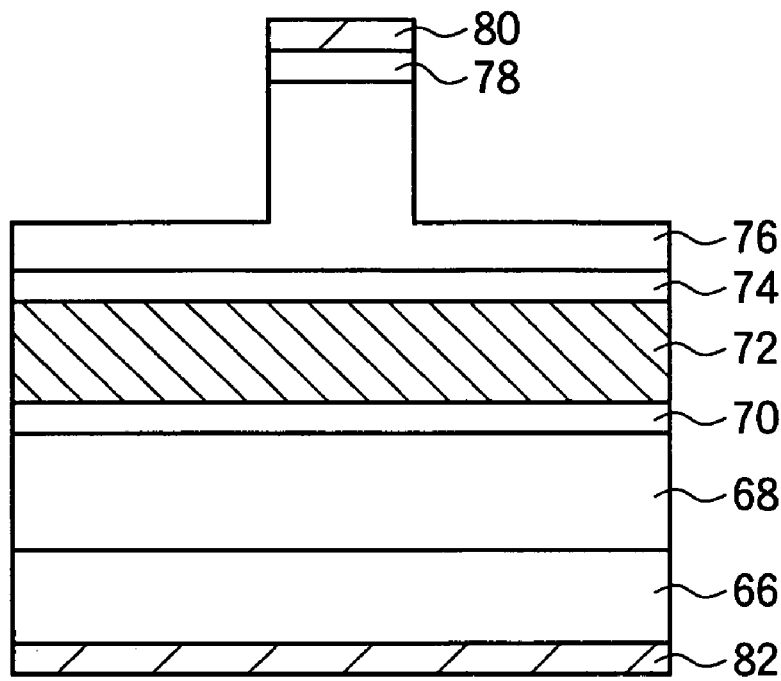
FIG. 22A is a sectional view showing the structure of the semiconductor device according to a seventh embodiment of the present invention.
Figure 22B:
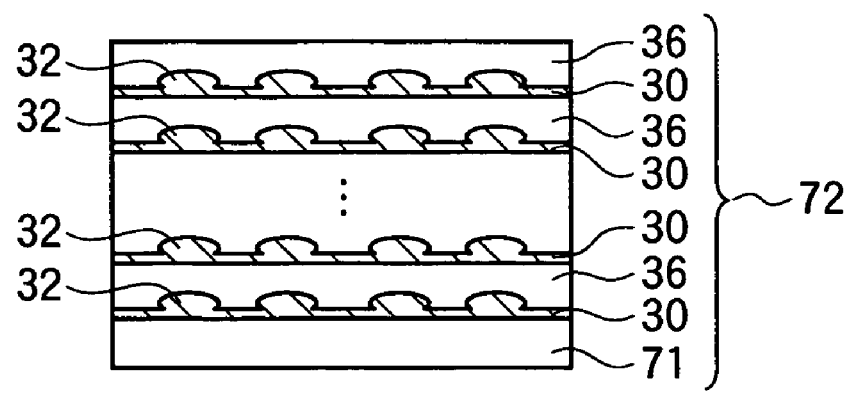
FIG. 22B is an enlarged sectional view showing the active layer in the semiconductor device according to the seventh embodiment of the present invention.
Figure 27:
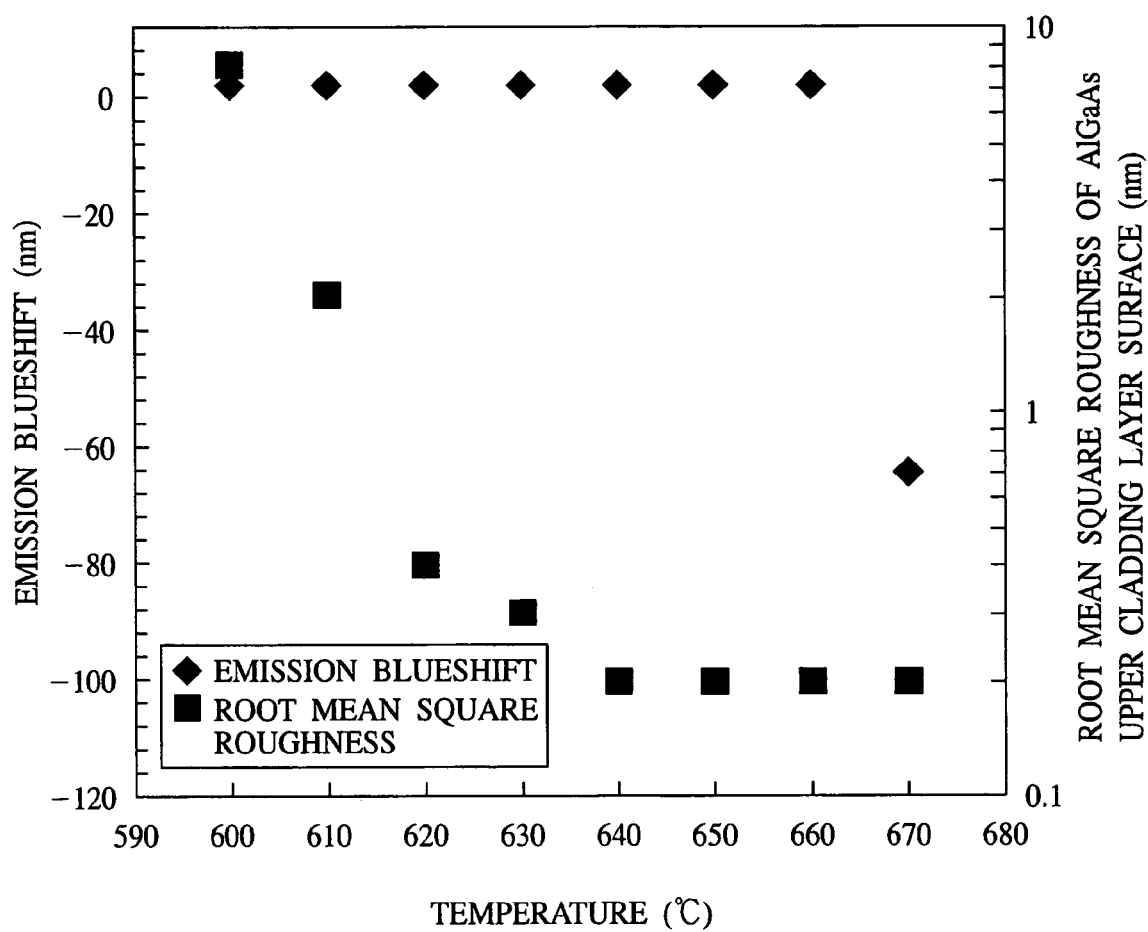
FIGS. 27 and 28 are graphs of the relationships between the growth temperature of the upper cladding layer and the root mean square roughness of the upper cladding layer surface, and between the anneal temperature of the quantum dots and the blueshift of the emission of the quantum dots.
Figure 28:
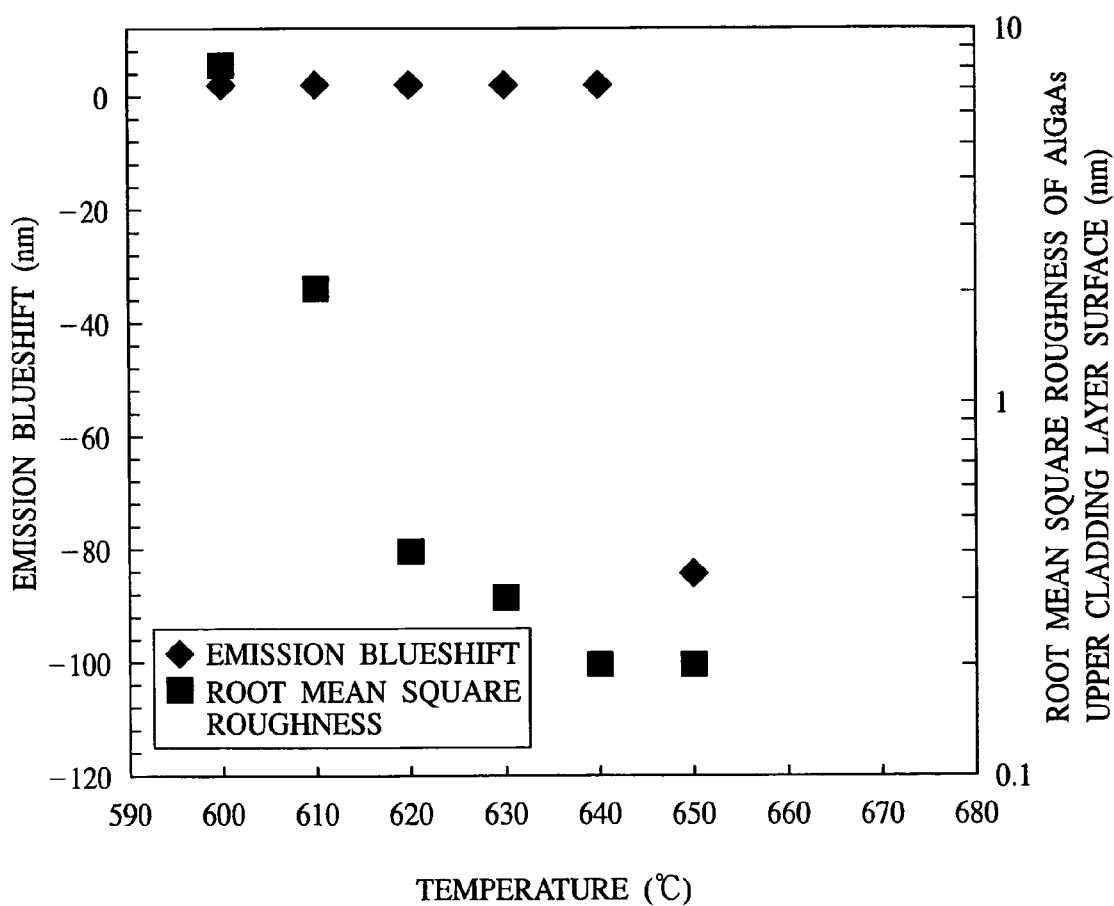

The method of manufacturing the semiconductor device according to a seventh embodiment of the present invention will be explained with reference to FIGS. 22 to 29B. FIG. 22A is a sectional view showing the structure of the semiconductor device according to the present embodiment. FIG. 22B is an enlarged sectional view showing the active layer in the semiconductor device according to the present embodiment. FIGS. 23A-23C, 24A-24C, 26A-26C and 29A-29B are sectional views showing the steps of the method of manufacturing the semiconductor device according to the present embodiment. FIG. 25 is a graph of the lower limit values and the upper limit values of the V/III ratios of the respective quantum dot layers in the growth when the quantum dots layers are grown into plural layers in the method of manufacturing the semiconductor device according to the present embodiment. FIGS. 27 and 28 are graphs of the relationships between the growth temperature of the upper cladding layer and the root mean square roughness of the upper cladding layer surface, and between the anneal temperature of the quantum dots and the blueshift of the emission of the quantum dots. The same members of the present embodiment as those of the method of manufacturing the semiconductor device according to the fifth embodiment are represented by the same reference numbers not to repeat or to simplify their explanation.

In the present embodiment, a ridge quantum dot laser including the active layer of the semiconductor laser, which uses the quantum dots 32 grown by the method of manufacturing the semiconductor device according to the fifth embodiment, as in the sixth embodiment will be explained.

First, the structure of the semiconductor device of the present embodiment will be explained with reference to FIGS. 22A and 22B.

As illustrated in FIG. 22A, an n-type lower cladding layer 68 of n-type AlGaAs is formed on an n-type GaAs substrate 66. The concentration of an n-type impurity implanted in the n-type GaAs substrate 66 is, e.g., $1 \times 10^{18}$ cm$^{-3}$. The composition of the lower cladding layer 68 is, e.g., $Al_{0.35}Ga_{0.65}As$. The concentration of the n-type impurity implanted in the lower cladding layer 68 is, e.g., $5 \times 10^{17}$ cm$^{-3}$. The film thickness of the lower cladding layer 68 is, e.g., 1-3 µm. The lower cladding layer 68 may be formed on the n-type GaAs substrate 66 with a buffer layer of n-type GaAs therebetween, as is the semiconductor device according to the sixth embodiment.

An SCH (Separate Confinement Heterostructure) layer 70 is formed on the lower cladding layer 68. The film thickness of the SCH layer 70 is, e.g., 40 nm.

An active layer 72 is formed on the SCH layer 70. As illustrated in FIG. 22B, the active layer 72 includes a plurality of the layer films (e.g., 5-10 layers) each of a quantum dot layer 30 of InAs and a capping layer 36 of GaAs grown by the method of manufacturing the semiconductor device according to the fifth embodiment. The capping layer 36 functions as a barrier layer. Between the quantum dot layer 30 of the first layer and the SCH layer 70, a barrier layer 71 of GaAs is formed. The barrier layer 71 and the capping layer 36 respectively have, e.g., a 40 nm-thickness. In FIG. 22B, a GaSb layer 42 (refer to FIG. 18C) is omitted.

A stress mitigating layer of InGaAs covering the quantum dot layer 30 including quantum dots 32 may be formed between the quantum dot layer 30 and the capping layer 36. In this case, the composition of the stress mitigating layer is, e.g., $In_{0.1}Ga_{0.9}As$.

In the present embodiment, in growing n layers (n is an integer of 2 or more) of the quantum dot layers 30 of InAs by MOCVD, the V/III ratio of the quantum dot layer 30 of the (i+1)-th layer (i is an integer satisfying $1 \leq i \leq n-1$) in the growth is set higher than the V/III ratio of the quantum dot layer 30 of the i-th layer in the growth. This permits a plurality of the quantum dot layer 30 to be repeatedly formed without defects and with the size distribution and the density of the quantum dots 32 uniform among the layers. This point will be described below.

As illustrated in FIG. 22A, on the active layer 72, an SCH layer 74 is formed. The film thickness of the SCH layer 74 is, e.g., 40 nm.

On the SCH layer 74, a p-type upper cladding layer 76 of p-type AlGaAs is formed. The composition of the upper cladding layer 76 is, e.g., $Al_{0.35}Ga_{0.65}As$. The concentration of a p-type impurity implanted in the upper cladding layer 76 is, e.g., $5 \times 10^{17}$-$1 \times 10^{18}$ cm$^{-3}$. The film thickness of the upper cladding layer 76 is, e.g., 1-3 µm.

On the upper cladding layer 76, a contact layer 78 of p-type GaAs is formed. The concentration of a p-type impurity implanted in the contact layer 78 is, e.g., $1 \times 10^{19}$ cm$^{-3}$. The film thickness of the contact layer 78 is, e.g., 0.5 µm.

The contact layer 78 and the upper cladding layer 78 are processed in a strip of, e.g., a 3 µm-width to form the ridge structure for stabilizing the transverse mode of the laser.

A p-side electrode 80 is formed on the contact layer 78.

An n-side electrode 82 is formed on the backside of the n-type GaAs layer 66.

Thus, the semiconductor device according to the present embodiment is constituted.

Next, the method of manufacturing the semiconductor device according to the present embodiment will be explained with reference to FIGS. 23A to 29B.

Figure 23A:
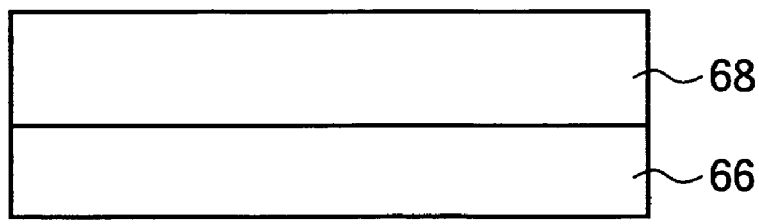
FIGS. 23A-23C, 24A-24C, 26A-26C and 29A-29B are sectional views showing the steps of the method of manufacturing the semiconductor device according to the seventh embodiment of the present invention.

First, on the n-type GaAs substrate 66, the n-type lower cladding layer 68 of n-type AlGaAs is grown by MOCVD (FIG. 23A). The concentration of an n-type impurity implanted in the n-type GaAs substrate 66 is, e.g., $1 \times 10^{18}$ cm$^{-3}$. The composition of the lower cladding layer 68 is, e.g., $Al_{0.35}Ga_{0.65}As$. The concentration of an n-type impurity implanted into the lower cladding layer 68 is, e.g., $5 \times 10^{17}$ cm$^{-3}$. The film thickness of the lower cladding layer 68 is, e.g., 1-3 µm. The Ga raw material of the lower cladding layer 68 in the growth is TMG.

Figure 23B:
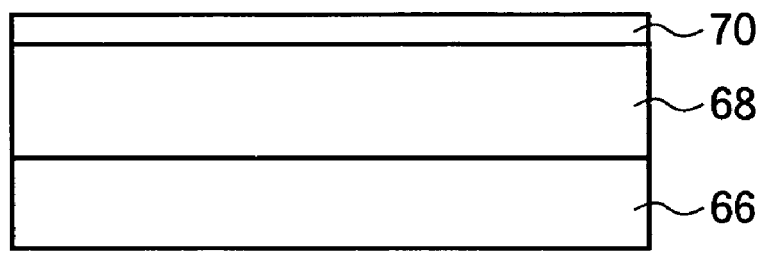

Then, on the lower cladding layer 68, the SCH layer 70 of GaAs is grown by MOCVD (FIG. 23B). The film thickness of the SCH layer 70 is, e.g., 40 nm.

Figure 23C:
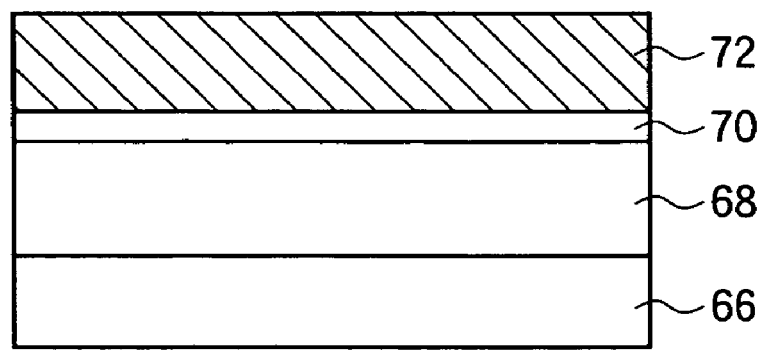

Then, on the SCH layer 70, the layer films of the quantum dot layer 30 and the capping layer 36 are repeatedly formed into plural layers (e.g., 5-10 layers) by the method of manufacturing the semiconductor device according to the fifth embodiment. Thus, the active layer 72 including a plurality of the quantum dot layers 30 is formed (FIG. 23C).

Here, the process for forming the active layer 72 will be detailed with reference to FIGS. 24A-24C and 25.

Figure 24A:
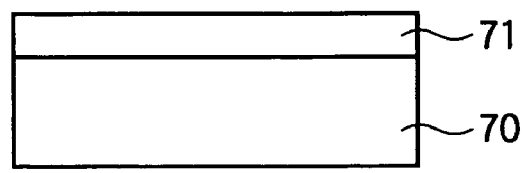
Figure 24B:
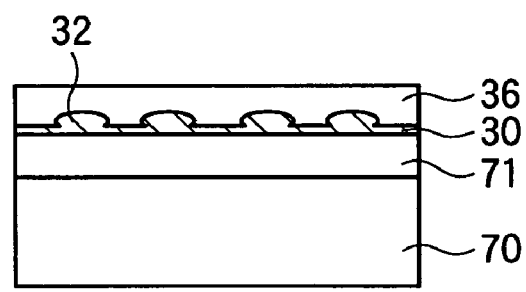
Figure 24C:
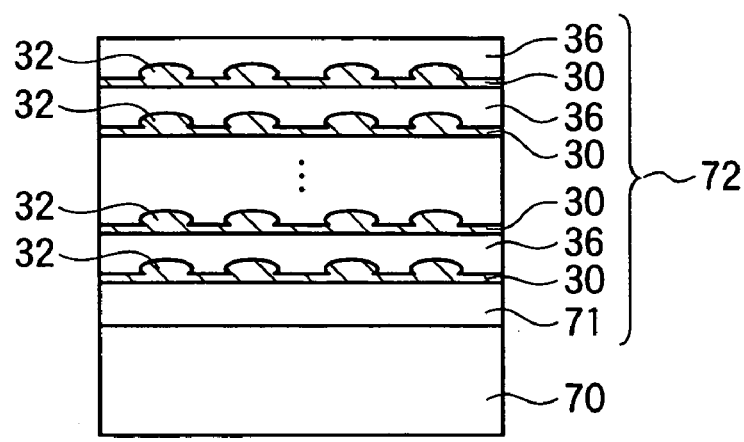
Figure 25:
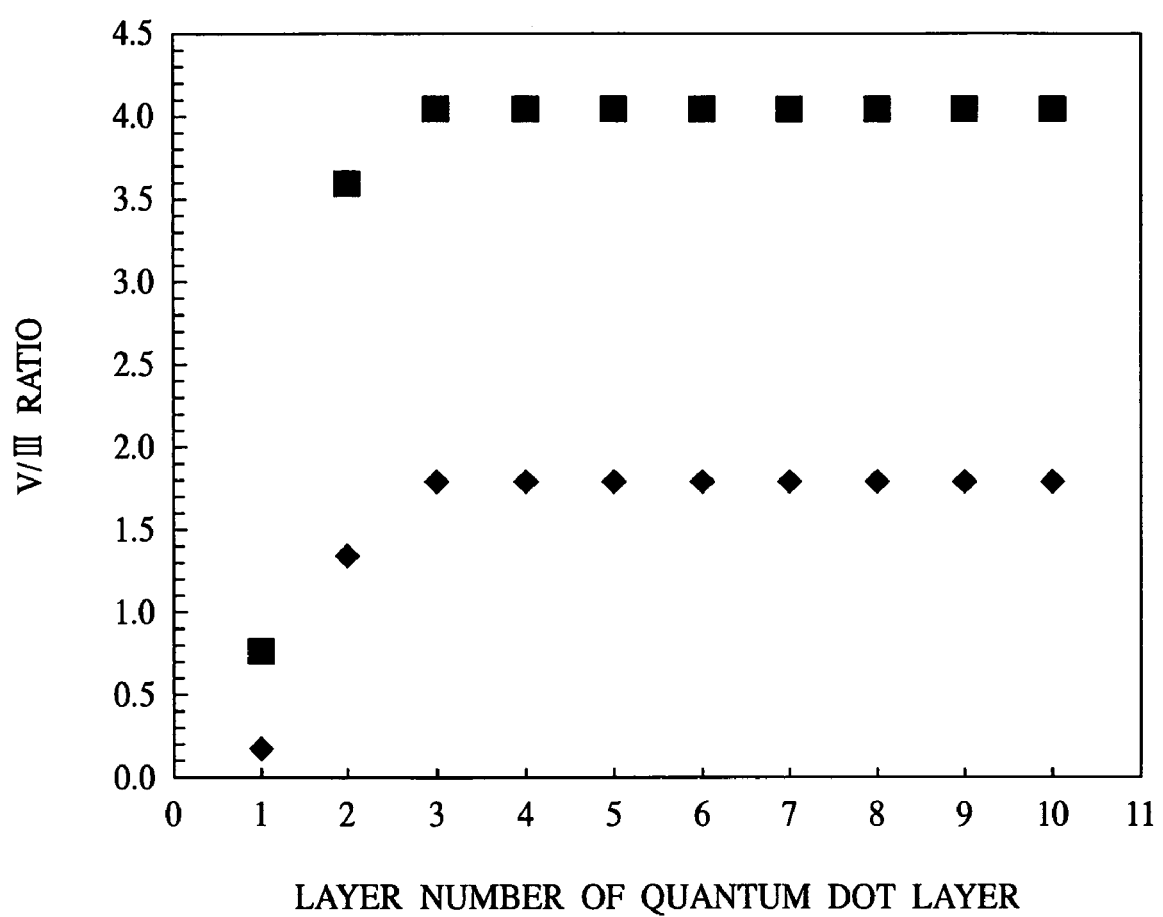
FIG. 25 is a graph of the lower limit values and the upper limit values of the V/III ratios of the respective quantum dot layers in the growth when the quantum dots layers are grown into plural layers in the method of manufacturing the semiconductor device according to the seventh embodiment of the present invention.

First, on the SCH layer 70, a barrier layer 71 of GaAs is grown by MOCVD (FIG. 24A). The film thickness of the barrier layer 71 is, e.g., 40 nm.

Then, the layer films of the quantum dot layer 30 and the capping layer 36 functioning as a barrier layer are repeatedly formed into plural layers (e.g., 5-10 layers) by the method of manufacturing the semiconductor device according to the fifth embodiment. The film thickness of the capping layer 36, i.e., the pitch of the quantum dot layer 30 is, e.g., 40 nm.

The stress mitigating layer of InGaAs covering the quantum dot layer 30 including the quantum dots 32 may be formed after each quantum dot layer 30 has been grown and before the capping layer 36 is grown. In this case, the composition of the stress mitigating layer is, e.g., $In_{0.1}Ga_{0.9}As$.

In the present embodiment, in growing n layers (n is an integer of 2 or more) of the quantum dot layers 30 of InAs by MOCVD, the V/III ratio of the quantum dot layer 30 of the (i+1)-th layer (i is an integer satisfying $1 \leq i \leq n-1$) in the growth is set higher than the V/III ratio of the quantum dot layer of the i-th layer in the growth. Thus, as the layer number of the quantum dot layer 30 is increased, the V/III ratio of the quantum dot layer 30 in the growth is gradually increased. Here, the V/III ratio in the growth of the quantum dot layer 30 is a ratio between a supply amount of a III raw material and a supply amount of a V raw material which are to be fed into the reaction chamber of an MOCVD apparatus when the quantum dot layer 30 is grown. In the present embodiment, the V/III ratio is a ratio between a supply amount of TMI and a supply amount of TBA.

When the V/III ratio for growing the quantum dot layers 30 are thus set, the V/III ratio of the respective quantum dot layers in the growth are set in the range shown in FIG. 25. FIG. 25 is a graph of the lower limit values and the upper limit values of the V/III ratios of the respective quantum dot layers 30 in the growth when a plurality of the quantum dots layers 30 are grown in the method of manufacturing the semiconductor device according to the present embodiment. The V/III ratio is taken on the vertical axis of the graph, and on the horizontal axis, the layer number of the quantum dot layers 30 is taken, i.e., which number-th layer the quantum dot layer 30 belongs to. In the graph, the .diamond-solid. marks indicate the lower limit values of the V/III ratios, and the .box-solid. marks indicate the upper limit values of the V/III ratios.

As illustrated in FIG. 25, the V/III ratio of the quantum dot layer 30 of the first layer in the growth is set at 0.1-0.8.

The V/III ratio of the quantum dot layer 30 of the second layer in the growth is set at 1.3-3.6.

The V/III ratio of the quantum dot layer 30 of the third layer is set at 1.8-4.0

The V/III ratio of the quantum dot layer 30 of the fourth layer and the following layers in the growth is set at 1.8-4.0.

The method of manufacturing the semiconductor device according to the present embodiment is characterized mainly in that when n layers (n is an integer of 2 or more) of the quantum dot layers 30 of InAs are grown, the V/III ratio of the quantum dot layer 30 of the (i+1)-th layer (i is an integer satisfying $1 \leq i \leq n-1$) in the growth is set higher than the V/III ratio of the quantum dot layer 30 of the i-th layer in the growth, and the V/III ratio of the quantum dot layer 30 is gradually increased as the layer number of the quantum dot layer 30 is increased.

The V/III ratio of the quantum dot layer 30 in the growth is thus set, whereby a plurality of the quantum dot layers 30 can be repeatedly formed without causing defects, and with the size distribution and the density of the quantum dots 32 retained uniform among the layers.

The lower limit values and the upper limit values of the V/III ratio of the quantum dot layer 30 in the growth shown in FIG. 25 are significant in forming repeatedly the quantum layers 30 into plural layers.

First, when the V/III ratio of one quantum dot layer 30 in the growth is lower than the lower limit value, the quantum dots 32 included in such quantum dot layer 30 have the density increased, but the size distribution much widened and the average size much reduced. Resultantly, the characteristics of the quantum dots 32 included in such quantum dot layer 30 are very different from those of the quantum dots 32 included in the below quantum dot layer 30, especially the quantum dots 32 included in the quantum dot layer 30 of the first layer. The quantum dots used in the quantum dot laser must have a size sufficient to realize a uniform size distribution and 1.3 µm emission wavelength. Accordingly, the quantum dots 32 grown with the V/III ratio lower than the lower limit value are unsuitable for the quantum dot laser.

When the V/III ratio of one quantum dot layer 30 exceeds the upper limit value, the density of coalesced islands is drastically increased in such quantum dot layer 30. These giant islands are plastically relaxed and have dislocations. These dislocations introduce non-radiative recombination centers in the quantum dot layer 30, and the optical characteristics of such quantum dot layer 30 are strongly deteriorated. Additionally, the giant islands hinder repeatedly forming a plurality of the quantum dot layers 30.

In the present embodiment, the V/III ratios of the respective dot layer 30 in the growth are set in the range of the upper limit values and the lower limit values shown in FIG. 25, whereby the quantum dot layers 30 including the quantum dots 32 suitable for the quantum dot laser can be repeated formed into plural layers.

Figure 26A:
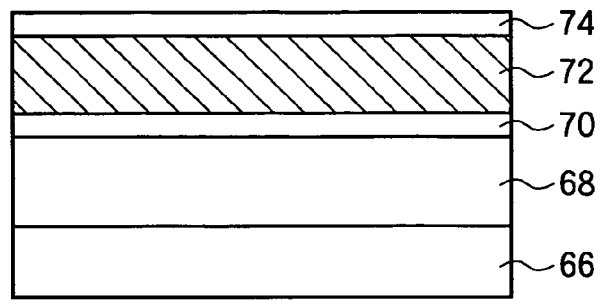
Figure 26B:
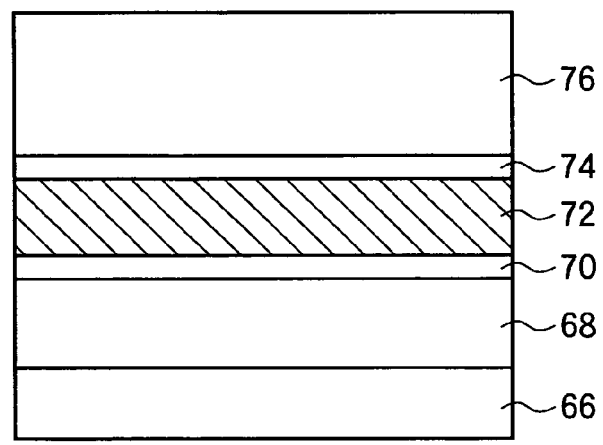

After the active layer 72 has been formed of a plurality of the quantum dot layers 30 thus repeatedly formed, the SCH layer 74 of GaAs is grown on the active layer 72 by MOCVD (FIG. 26A). The film thickness of the SCH layer 74 is, e.g., 40 nm.

Then, on the SCH layer 74, the p-type upper cladding layer 76 of p-type AlGaAs is grown by MOCVD. The composition of the upper cladding layer 76 is, e.g., $Al_{0.35}Ga_{0.68}As$. The concentration of a p-type impurity implanted into the upper cladding layer 76 is, e.g., $5 \times 10^{17}$-$1 \times 10^{18}$ $cm^{-3}$. The film thickness of the upper cladding layer 76 is, e.g., 1-3 µm. As the conditions for growing the upper cladding layer 76, the substrate temperature, i.e., the growth temperature is 610-660° C., the raw material gases to be fed into the reaction chamber of the MOCVD apparatus are TMA (trimethylaluminum) as the Al raw material, TMG as the Ga raw material and TBA as the As raw material.

As described above, one main characteristic of the method of manufacturing the semiconductor device according to the present embodiment is that the upper cladding layer 76 is grown with the growth temperature set at 610-660° C. and with TMG as the Ga material fed into the reaction chamber of an MOCVD apparatus.

Here, the relationships between the growth temperature of the upper cladding layer 76 of AlGaAs, and the root mean square roughness of the surface of the upper cladding layer 76 and the blueshift of the emission of the quantum dots 32 will be explained with reference to FIGS. 27 and 28.

FIG. 27 is a graph of the relationships between the growth temperature of the upper cladding layer of AlGaAs and the root mean square roughness of the upper cladding layer surface, and the relationships between the anneal temperature of the quantum dot layer and the blueshift of the emission of the quantum dots. In FIG. 27, the stress mitigating layer of $In_{0.1}Ga_{0.9}As$ for covering the quantum dot layer including the quantum dots was not formed. The film thickness of the capping layer was 40 nm, and the quantum dot layers were formed repeatedly into five layers. The peak emission wavelength of the quantum dots in the ground state was 1.28 µm. The root mean square roughness of the upper cladding layer surface is taken on the right vertical axis of the graph, and the blueshift of the emission is taken on the left vertical axis, and the growth temperature of the upper cladding layer with respect to the root mean square roughness, and the anneal temperature of the quantum dot layers with respect to the blueshift of the emission are taken on the horizontal axis of the graph. In the graph, the ■ marks indicate the root mean square roughness of the upper cladding layer surface, and the ♦ marks indicate the blueshift of the emission of the quantum dots.

The quality of the surface morphology of the crystals forming a quantum dot laser is one of the very important elements which influence the performance of the laser. That is, preferably the crystal surface is as flat as possible. The quality of such crystal morphology can be dramatically improved by raising the growth temperature of the crystals.

As shown in FIG. 27, when the upper cladding layer of a 1.0-1.4 µm-thickness AlGaAs is formed at a growth temperature of below 600° C. including 600° C., the surface of the upper cladding layer is as rough as above 5 nm-root mean square roughness.

In contrast to this, when the growth temperature is 610° C., the roughness of the upper cladding layer is dramatically improved, and the root mean square roughness is about 2 nm. Furthermore, when the growth temperature is above 620° C. including 620° C., the surface of the upper cladding layer is as flat as below 0.4 nm root mean square roughness including 0.4 nm root mean square roughness. When the growth temperature is above 640.degree. C. including 640° C., the upper cladding layer surface is as flat as about 0.2 nm root mean square roughness.

In the present embodiment, in which the upper cladding layer 76 is grown at a growth temperature of above 610° C. including 610° C., the upper cladding layer 76 which has high crystal quality and is flat can be grown, whereby the roughness of the interface between the SCH layer 74 ad the upper cladding layer 76 and the roughness of the interface between the upper cladding layer 76 and the contact layer 78 to be grown in a later step can be reduced. This decreases the scattering loss of light of the quantum dot laser.

In the present embodiment, as will be described below, even when the upper cladding layer 76 is grown at such a relatively high growth temperature, the quantum dots 32 are never broken, and the emission characteristics of the quantum dots 32 are never degraded.

In growing the upper cladding layer, the active layer including the quantum dots are annealed to a very high temperature.

In the conventional growing process for growing the quantum dots of InAs and the capping layer of GaAs without using Sb, when the quantum dots are annealed to a very high temperature, the emission wavelength of the quantum dots is shifted to the shorter wavelength side, i.e., makes the blueshift. Furthermore, the quantum dots are often broken.

In contrast to this, in the present invention, in which the quantum dots of InAs and the capping layer of GaAs are grown with Sb used, the anneal is not substantially influential. Even when the quantum dots are annealed to a very high temperature, the emission wavelength of the quantum dots never make the blueshift, and the quantum dots are never broken.

In FIG. 27, the blueshift of the emission of the quantum dots of the present invention for the anneal of 30 minutes processing period of time equivalent to the growth of the AlGaAs upper cladding layer of a 1.4 µm-thickness at an about 0.8 nm/s growth rate. Here, the blueshift of the emission of the quantum dots means a difference in the peaks of the emission wavelength of the quantum dots between before and after the anneal. The value 0 of the blueshift of the emission means that the peak emission wavelength of the quantum dots does not change. The negative value means that the peak of the emission wavelength of the quantum dots makes the blueshift, and a larger absolute value means a larger shift amount.

Based on the graph of FIG. 27, it is found that the peak emission wavelength does not make the blueshift up to the 660° C. anneal temperature, but in contrast to this, at the anneal temperature of above 670° C. including 670° C., the peak emission wavelength of the quantum dots makes the blueshift by above 70 nm including 70 nm.

In the present embodiment, in which the upper cladding layer 76 is grown at a growth temperature of below 660° C. including 660° C., when the upper cladding layer 76 is grown, the peak emission wavelength of the quantum dots 32 included in the active layer 72 never make the blueshift.

As described above, in the present embodiment, because the upper cladding layer 76 of AlGaAs is grown at a growth temperature of 610-660° C., the upper cladding layer 76 which has high crystal quality and is flat can be grown without deteriorating the emission characteristics of the quantum dots 32 and breakage of the quantum dots 32.

It is known that the blueshift of the emission of quantum dots depends on the covering state of the quantum dots.

FIG. 28 as well as FIG. 27 shows the relationships between the anneal temperature of the quantum dot layer and the blueshift of the emission of the quantum dots in the case that the stress mitigating layer of $In_{0.1}Ga_{0.9}As$ for covering the quantum dot layer including the quantum dots is formed. The layer structure of the quantum dot layers in FIG. 28 is the same as the layer structure in FIG. 27 except that, in FIG. 28, the stress mitigating layer is formed. In FIG. 28, the peak emission wavelength of the quantum dots in the ground state is 1.305 µm.

Based on the graph of FIG. 28, with the stress mitigating layer formed, it is found that the peak emission wavelength of the quantum dots does not make the blueshift up to the anneal temperature of 640° C. In contrast to this, at the anneal temperatures of above 650° C. including 650° C., the peak emission wavelength of the quantum dots makes the blueshift by 70 nm and more.

Accordingly, when the stress mitigating layer covering the quantum dot layer 30 including the quantum dots 32 is formed, it is preferable to set the growth temperature of the upper cladding layer 76 at 610-640° C.

Figure 26C:
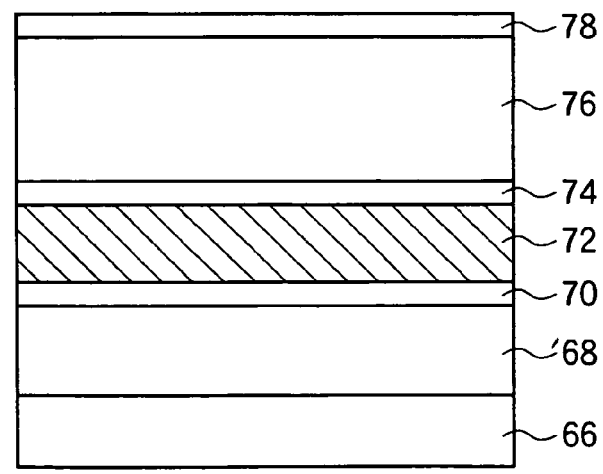

After the upper cladding layer 76 has been thus grown, the contact layer 78 of p-type GaAs is grown on the upper cladding layer by MOCVD (FIG. 26C). The concentration of a p-type impurity to be implanted into the contact layer 78 is, e.g., $1\times10^{19}$ $cm^{-3}$. The film thickness of the contact layer 78 is, e.g., 0.5 µm. As the conditions for growing the contact layer 78, the growth temperature is lowered from the growth temperature of the upper cladding layer 76 to 600-610° C., and the raw material gases to be fed into the reaction chamber of the MOCVD apparatus is, as the Ga raw material, TEG in place of TMG used in the growth of the upper cladding layer 76 and TBA as the As raw material.

As described above, one main characteristic of the method of manufacturing the semiconductor device according to the present embodiment is that the contact layer 78 is grown by lowering the growth temperature of the upper cladding layer 76 to the growth temperature of 600-610° C. and feeding into the reaction chamber of the MOCVD apparatus, as the Ga raw material, TEG in place of TMG used in growing the upper cladding layer 76.

The contact layer 78 is grown under these growing conditions, whereby the contact layer 78 of high crystal quality can be grown, the roughness of interface between the upper cladding layer 76 and the contact layer 78 can be further reduced. Thus, the scattering loss of the light of the quantum dot laser can be further decreased. The leak current of the quantum dot laser can be decreased.

The contact layer 78 is grown at the growth temperature of 600-610° C., whereby the emission characteristics of the quantum dots 32 are never deteriorated in growing the contact layer 78. The quantum dots 32 are never broken.

Figure 29A:
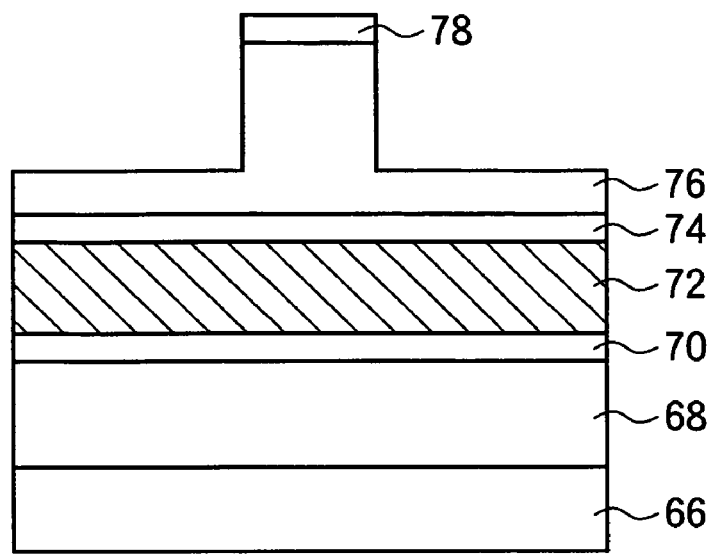

Next, the contact layer 78 and the upper cladding layer 76 are processed into a stripe of, e.g., 3 µm, leaving the upper cladding layer 76 on the SCH layer 74 by about 10-100 nm (FIG. 29A).

Figure 29B:
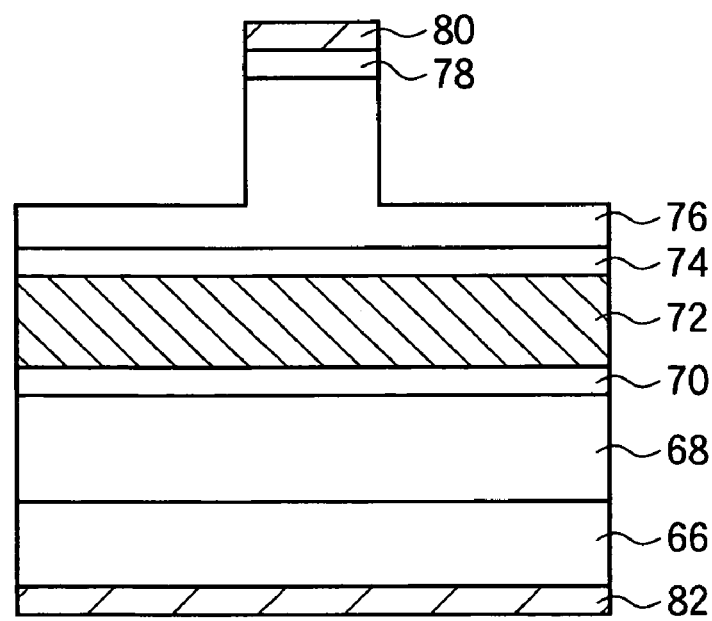

Then, the p-side electrode 80 is formed on the contact layer 78, and the n-side electrode 82 is formed on the backside of the GaAs substrate 62 (FIG. 29B).

Thus, the semiconductor device according to the present embodiment is manufactured.

As described above, according to the present embodiment, in growing n layers of the quantum dot layer 30 of InAs are grown by MOCVD, the V/III ratio of the quantum dot layer 30 of the (i+1)-th layer in the growth is set higher than the V/III ratio of the quantum dot layer 30 of the i-th layer in the growth, and the V/III ratio of the quantum dot layer 30 in the growth is gradually increased as the layer number of the quantum dot layer 30 is increased, whereby the quantum dot layers 30 can be repeatedly formed into plural layers without causing defects and with the size distribution and the density of the quantum dots 32 retained uniform among the quantum dot layers 30.

According to the present embodiment, the upper cladding layer 76 is grown at the growth temperature of 610-660° C. and by feeding TMG as the Ga raw material into the reaction chamber of the MOCVD apparatus, whereby the upper cladding layer 76 which has high crystal quality and is flat can be grown without deteriorating the emission characteristics of the quantum dots 32 and breaking the quantum dots 32. Thus, the roughness of the interface between the SCH layer 74 and the upper cladding layer 76 and the roughness of the interface between the upper cladding layer 76 and the contact layer 78 can be reduced. Accordingly, the scattering loss of light of the quantum dot laser can be decreased.

Furthermore, according to the present embodiment, the contact layer 78 is grown by lowering the growth temperature of the upper cladding layer 76 to the growth temperature of 600-610.degree. C. and feeding into the chamber of the MOCVD apparatus, as the Ga raw material, TEG in place of TMG used in growing the upper cladding layer 76, whereby the contact layer 78 of high crystal quality can be formed without deteriorating the emission characteristics of the quantum dots 32 and breaking the quantum dots 32. Accordingly, the roughness of the interface between the upper cladding layer 76 and the contact layer 78 can be further reduced. Thus, the leak current of the quantum dot laser can be decreased.

In the above, the layer films of the quantum dot layer 30 and the capping layer 36 are formed repeatedly into plural layers by the method of manufacturing the semiconductor device according to the fifth embodiment, but by the method of manufacturing the semiconductor device according to the first to the fourth embodiment, the layer films of the quantum dot layer 30 and the capping layer 36 are formed repeatedly into plural layers. In this case as well the V/III ratios of the quantum dot layers 30 in the growth are set as described above, and as the layer number of the quantum dot layers 30 is increased, the V/III ratios of the quantum dot layers 30 in the growth are gradually increased, whereby the quantum dot layers 30 can be formed repeatedly into plural layers without causing defects and with the size distribution and the density of the quantum dots 32 retained uniform among the layers.

In the above, the layer films of the quantum dot layer 30 and the capping layer 36 are formed repeatedly. However, one layer film of the quantum dot layer 30 and the capping layer 36 may be formed by the method of manufacturing the semiconductor device according to any one of the first to the fifth embodiments. In this case as well, the upper cladding layer 76 is grown under the same growing conditions as described above, whereby the upper cladding layer 76 which has good crystal quality and is flat can be grown without deteriorating the emission characteristics of the quantum dots 32 and breaking the quantum dots 32. The contact layer 78 is grown under the same growing conditions as described above, whereby the contact layer 78 of high crystal quality can be grown without deteriorating the emission characteristics of the quantum dots 32 and breaking the quantum dots 32.

An Eighth Embodiment

Figure 30A:
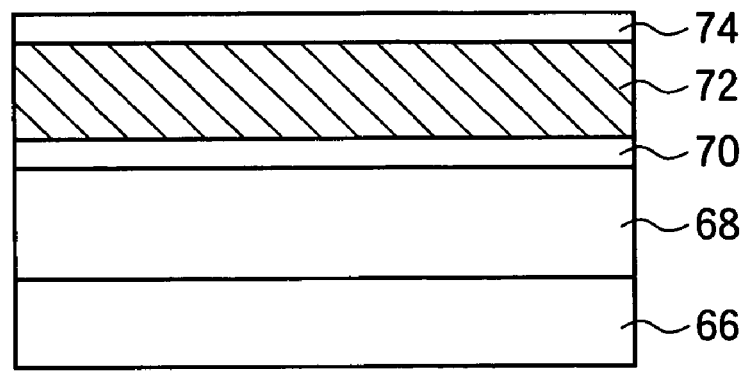
FIGS. 30A and 30B are sectional views showing the steps of the method of manufacturing the semiconductor device according to an eighth embodiment of the present invention.
Figure 30B:
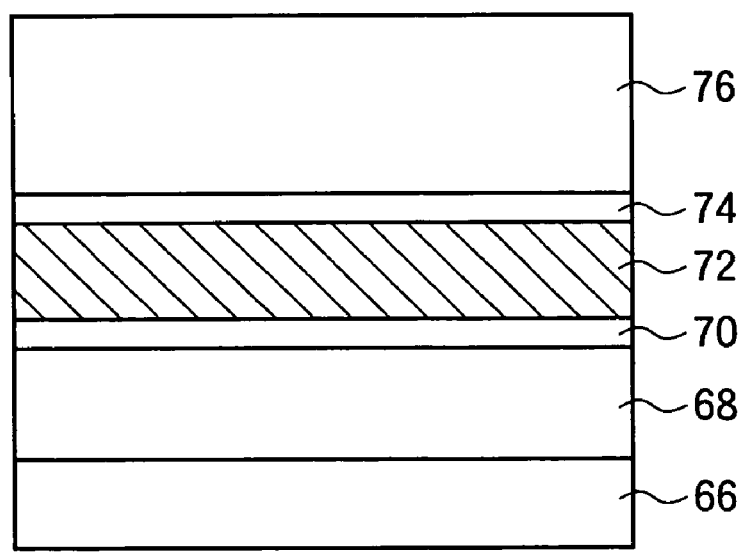
Figure 31A:
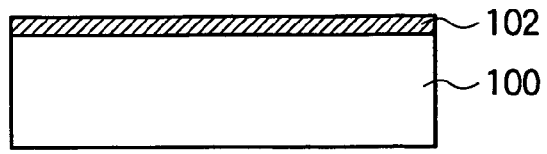
FIGS. 31A-31D are sectional views showing the steps of the conventional method of growing quantum dots.
Figure 31B:
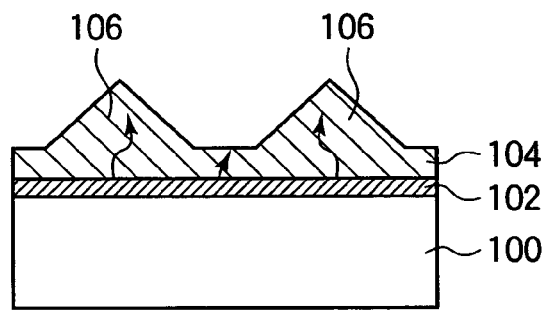
Figure 31C:
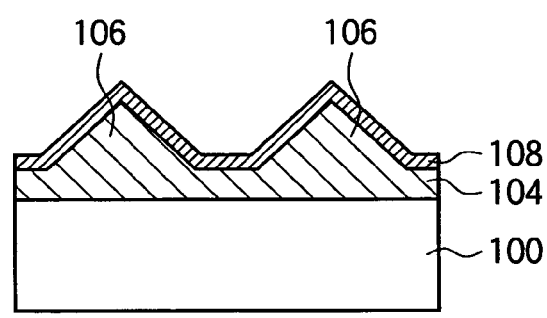
Figure 31D:
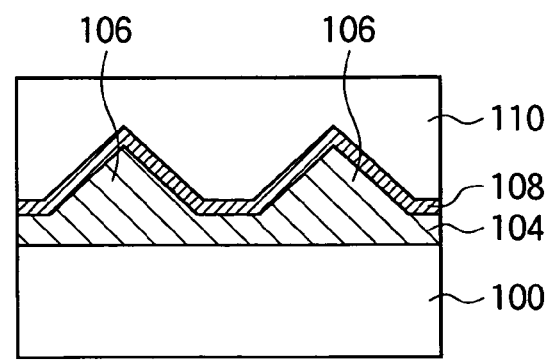

The method of manufacturing the semiconductor device according to an eighth embodiment of the present invention will be explained with reference to FIGS. 30A and 30B. FIGS. 30A and 30B are sectional views showing the steps of the method of manufacturing the semiconductor device according to the present embodiment. The same members of the present embodiment as those of the method of manufacturing the semiconductor device according to the seventh embodiment are represented by the same reference numbers not to repeat or to simplify their explanation.

The method of manufacturing the semiconductor device according to the present embodiment is substantially the same as the method of manufacturing the semiconductor device according to the seventh embodiment. The method of manufacturing the semiconductor device according to the present embodiment is characterized in that the upper cladding layer 76 is grown without using a dopant and controlling the V/III ratio of the upper cladding layer 76 in the growth, whereby the p-type carrier concentration of the upper cladding layer 76 is controlled.

First, in the same way as in the method of manufacturing the semiconductor device according to the seventh embodiment, on the n-type GaAs substrate 66, the layers up to the SCH layer 74 including the SCH layer 74 are formed (FIG. 30A).

Then, on the SCH layer 74, a p-type upper cladding layer 76 of p-type AlGaAs is grown by MOCVD (FIG. 30B). The composition of the upper cladding layer 76 is, e.g., $Al_{0.35}Ga_{0.65}As$. The film thickness of the upper cladding layer 76 is, e.g., 1-3 μm. As the conditions for growing the upper cladding layer 76, the growth temperature is 610-660° C., the raw material gases to be fed into the reaction chamber of the MOCVD apparatus are TMA as the Al raw material, TMG as the Ga raw material and TBA as the As raw material.

In the present embodiment, in growing the upper cladding layer 76, the p-type carrier concentration of the upper cladding layer 76 is controlled not by feeding a dopant for controlling the p-type carrier concentration into the reaction chamber of the MOCVD but by controlling the V/III ratio of the upper cladding layer 78 in the growth. Here, the V/III ratio in the growth of the upper cladding layer 76 is a ratio between a supply amount of III raw materials and a supply amount of a V raw material to be fed into the reaction chamber of the MOCVD when the upper cladding layer 76 is grown. In the present embodiment, the V/III ratio is a ratio between a supply amount of TMA and TMG and a supply amount of TBA.

The p-type carrier concentration of the upper cladding layer 76 decreases as the V/III ratio of the upper cladding layer 76 in the growth increases. The concentration increases as the V/III ratio decreases. Specifically, the p-type carrier concentration of the upper cladding layer 76 decreases as the partial pressure of TBA in the growth of the upper cladding layer 76, which is the V raw material in the reaction chamber of the MOCVD apparatus, increases, and the former increases as the partial pressure of TBA decreases.

In the present embodiment, based on such relationship between the V/III ratio and the p-type carrier concentration, the V/III ratio of the upper cladding layer 76 in the growth is controlled within the range of, e.g., 1-10, whereby the p-type carrier concentration of the upper cladding layer 76 is controlled to be in the range of, e.g., $10^{17}$-$10^{18}$ cm$^{-3}$. The p-type carrier concentration of the upper cladding layer 76 depends on the growth temperature in addition to the V/III ratio, and the V/III ratio is suitably set depending on the growth temperature.

When the growth temperature of the upper cladding layer 76 is 610-660° C., to be specific, the V/III ratio is set as follows.

For example, when the p-type carrier concentration of the upper cladding layer 76 is set at $6\times10^{17}$ cm$^{-3}$, the V/III ratio of the upper cladding layer 76 in the growth is set at 5-8.

For example, when the p-type carrier concentration of the upper cladding layer 76 is set at $1.0\times10^{18}$ cm$^{-3}$, the V/III ratio of the upper cladding layer 76 in the growth is set at 3-6.

As described above, in the method of manufacturing the semiconductor device according to the present embodiment, the p-type carrier concentration of the upper cladding layer 76 is controlled not by using a dopant but by controlling the V/III ratio of the upper cladding layer 76 in the growth, which allows the p-type carrier concentration of the upper cladding layer 76 to be easily set at a desired concentration.

It is preferable that the V/III ratio of the upper cladding layer 76 in the growth is controlled to decrease from the side of the upper cladding layer 76 nearer to the active layer 72 toward the side thereof nearer to the contact layer 78, i.e., to be higher in the part of the upper cladding layer 76, which is nearer to the active layer 72 than the rest part.

The steps following such growth of the upper cladding layer 76 are the same as those of the method of manufacturing the semiconductor device according to the seventh embodiment, and their explanation will not be repeated.

As described above, according to the present embodiment, the p-type carrier concentration of the upper cladding layer 76 is controlled not by using a dopant but by controlling the V/III ratio of the upper cladding layer 76 in the growth, which allows the p-type carrier concentration of the upper cladding layer 76 to be easily set at a desired concentration.

Modified Embodiments

The present invention is not limited to the above-described embodiments and can cover other various modifications.

For example, in the above-described embodiments, as the quantum dot layer 30, an InAs layer is grown. However, the material of the quantum dot layer 30 is not limited to this. As the material of the quantum dot layer 30, materials having lattice constants different from the lattice constant of the buffer layer 28 can be suitably used. For example, other III-V semiconductors can be used.

In the above-described embodiments, as the capping layer 36, a GaAs layer is grown. However, the material of the capping layer 36 is not limited to this. As the material of the capping layer 36, InGaAs, etc. can be used.

In the above-described embodiments, the semiconductor layers are grown by MOCVD. However, the method of growing the semiconductor layers is not limited to this. For example, the semiconductor layers may be grown by molecular beam epitaxy (MBE) or others.

In the above-described embodiments, TMSb as the organic Sb raw material is irradiated to the surface of the quantum dot layer 30. However, the organic Sb raw material to be used in irradiating Sb is not limited to this. An organic Sb raw material gas other than TMSb, such as TESb, etc. is irradiated to the surface of the quantum dot layer 30 to thereby irradiate Sb.

In the above-described embodiments, TMSb and TEG are concurrently irradiated to the surface of the quantum dot layer 30. However, the organic metal raw materials to be used in irradiating GaSb are not limited to them. For example, the above organic Sb raw material gas and an organic Ga raw material gas other than TEG such as TMGa, etc. are concurrently irradiated to thereby irradiate GaSb. An organic Sb raw material gas and an organic raw material gas of group III metal (In, Al) other than Ga may be concurrently irradiated.

In the above-described embodiments, TMSb is irradiated to the surface of the buffer layer 28 before the quantum dot layer 30 is grown. However, the irradiation of Sb is not limited to this. The above-described organic Sb raw material gas other than TMSb is irradiated to the surface of the buffer layer 28 to thereby irradiate Sb.

In the above-described embodiments, Sb is irradiated to the surface of the buffer layer 28 before the quantum dot layer 30 is grown. However, Sb may be irradiated to the surface of the buffer layer 28 while the quantum dot layer 30 is growing. GaSb may be irradiated to the surface of the buffer layer 28 before the quantum dot layer 30 is grown or while the quantum dot layer 30 is growing. The irradiation of GaSb can be made by concurrently irradiating an organic Sb raw material gas and an organic Ga raw material gas to the surface of the buffer layer 28.

In the above-described embodiments, TBA is irradiated for a prescribed period of time to the surface of the quantum dot layer 30 to etch the surface of the quantum dot layer 30 with TBA. The As raw material to be irradiated to the surface of the quantum dot layer 30 for a prescribed period of time is not limited to this. For example, $AsH_3$, $As_2$, $As_4$, etc. other than TBA can be used.

In the above-described embodiments, TBA is irradiated to the surface of the quantum dot layer 30 for a prescribed period of time to thereby remove the InSb laser 46. The surface of the quantum dot layer 30 may be etched by other methods to thereby remove the InSb layer 46.

In the sixth to the eighth embodiments, the lower cladding layers 54, 68 and the upper cladding layers 60, 76 are formed of AlGaAs. However, the materials of the lower cladding layer and the upper cladding layer are not limited to this and can be, e.g., other III-V compound semiconductors.

In the sixth to the eighth embodiments, the contact layers 60, 78 are formed of GaAs. However, the material of the contact layer is not limited to this and may be formed of, e.g., other III-V compound semiconductors.

In the seventh and the eighth embodiments, SCH layers 70, 74 are formed. However, these layers may not be essentially formed. When the SCH layer 74 is not formed, the upper cladding layer 76 is grown under the above-described conditions, whereby the roughness of the interface between the active layer 72 and the upper cladding layer 76 can be reduced.

In the sixth to the eighth embodiments, the present invention is applied to the quantum dot laser including the quantum dot layers in the active layer. The present invention is applicable, in addition to the quantum dot laser, optical semiconductor devices including quantum dot layers in the active layers, such as quantum dot light amplifiers, quantum dot wavelength converters, quantum dot waveform shapers, etc.

What is claimed is:

1. A method of manufacturing a semiconductor device comprising:

forming a base layer without irradiating an Sb raw material gas on a substrate; forming a Sb or GaSb layer to a surface of the base layer by irradiating Sb or GaSb to the surface of the base layer;

forming a quantum dot directly on the Sb or GaSb layer by self-assembled growth without irradiating an Sb raw material gas;

etching the surface of the quantum dot with teriarybutylarsine (TBA) to remove a surface layer containing Sb deposited on the surface of the quantum dot; and growing a capping layer on the quantum dot without irradiating an Sb raw material gas.

2. The method of manufacturing a semiconductor device according to claim 1, further comprising, after removing the surface layer and before growing the capping layer, irradiating an organic Sb raw material gas to the surface of the quantum dot.

3. The method of manufacturing a semiconductor device according to claim 2, wherein when irradiating the organic Sb raw material gas, the organic Sb raw material gas and a group III metal organic raw material gas are concurrently irradiated.

4. The method of manufacturing a semiconductor device according to claim 1, further comprising forming an active layer including the quantum dot and growing a cladding layer above the active layer at a growth temperature of 610-660° C. by using trimethylgallium as a Ga raw material.

5. The method of manufacturing a semiconductor device according to claim 4, further comprising, after growing the cladding layer, growing a contact layer above the cladding layer at a growth temperature of 600-610° C. by using triethylgallium as a Ga raw material.

6. The method of manufacturing a semiconductor device according to claim 1, further comprising:

forming an active layer including the quantum dot;

growing a cladding layer above the active layer; and growing a contact layer above the cladding layer at a growth temperature of 600-610° C. by using triethylgallium as a Ga raw material.

7. A method of manufacturing a semiconductor device comprising:

repeating growing a quantum dot layer including a quantum dot formed by self-assembled growth;

irradiating Sb or GaSb to a surface of a base layer of the quantum dot layer before or in growing the quantum dot layer; and growing a capping layer on the quantum dot layer to thereby form above a semiconductor substrate an active layer including n layers (n is an integer of 2 or more) of the quantum dot layers, when forming the active layer, a V/III ratio of the quantum dot layer of the (i+1)-th layer (i is an integer satisfying 1.ltoreq.i.ltoreq.n−1) in the growth being set higher than a V/III ratio of the quantum dot layer of the i-th layer in the growth, wherein the V/III ratio is a ratio between a supply amount of group III raw material and a supply amount of group V raw material.

8. The method of manufacturing a semiconductor device according to claim 7, further comprising:

irradiating an As raw material gas to a surface of the quantum dot for a prescribed period of time or etching the surface of the quantum dot to thereby remove a surface layer containing Sb deposited on the surface of the quantum dot.

9. The method of manufacturing a semiconductor device according to claim 8, further comprising, after removing the surface layer and before growing the capping layer, irradiating an organic Sb raw material gas to the surface of the quantum dot layer.

10. The method of manufacturing a semiconductor device according to claim 9, wherein when irradiating the organic Sb raw material gas, the organic Sb raw material gas and a group III metal organic raw material gas are concurrently irradiated.

11. The method of manufacturing a semiconductor device according to claim 7, further comprising, after forming the active layer, growing a cladding layer above the active layer at a growth temperature of 610-660° C. by using trimethylgallium as a Ga raw material.

12. The method of manufacturing a semiconductor device according to claim 11, further comprising, after growing the cladding layer, growing a contact layer above the cladding layer at a growth temperature of 600-610° C. by using triethylgallium as a Ga raw material.

13. The method of manufacturing a semiconductor device according to claim 7, further comprising, after forming the active layer, growing a cladding layer above the active layer; and growing a contact layer above the cladding layer at a growth temperature of 600-610° C. by using triethylgallium as a Ga raw material.

14. The method of manufacturing a semiconductor device according to claim 7, further comprising:

after forming the active layer, growing a cladding layer above the active layer; and growing a contact layer above the cladding layer at a growth temperature of 600-610° C. by using triethylgallium as a Ga raw material.

* * * * *